(12) United States Patent
Trinh et al.

(10) Patent No.: US 11,443,898 B2
(45) Date of Patent: Sep. 13, 2022

(54) MULTILAYER BROADBAND CERAMIC CAPACITOR WITH INTERNAL AIR GAP CAPACITANCE

(71) Applicant: Presidio Components. Inc., San Diego, CA (US)

(72) Inventors: Hung Van Trinh, La Jolla, CA (US); Alan Devoe, La Jolla, CA (US); Lambert Devoe, San Diego, CA (US)

(73) Assignee: Presidio Components. Inc., San Diego, CA (US)

( * ) Notice: Subject to any disclaimer, the term of this patent is extended or adjusted under 35 U.S.C. 154(b) by 67 days.

(21) Appl. No.: 16/156,708

(22) Filed: Oct. 10, 2018

(65) Prior Publication Data

US 2019/0043669 A1    Feb. 7, 2019

Related U.S. Application Data

(63) Continuation-in-part of application No. 15/942,987, filed on Apr. 2, 2018, now abandoned.

(60) Provisional application No. 62/483,794, filed on Apr. 10, 2017.

(51) Int. Cl.
| | |
|---|---|
| *H01G 4/30* | (2006.01) |
| *H01G 4/12* | (2006.01) |
| *H01G 4/35* | (2006.01) |
| *H01G 4/012* | (2006.01) |
| *H01L 49/02* | (2006.01) |

(52) U.S. Cl.
CPC .............. *H01G 4/30* (2013.01); *H01G 4/012* (2013.01); *H01G 4/12* (2013.01); *H01G 4/35* (2013.01); *H01L 28/40* (2013.01)

(58) Field of Classification Search
CPC .......... H01G 4/30; H01G 4/12; H01G 4/0085; H01G 4/005; H01G 4/012; H01G 4/35
See application file for complete search history.

(56) References Cited

U.S. PATENT DOCUMENTS

| | | | |
|---|---|---|---|
| 2,336,091 A | * | 12/1943 | Gray .................. H01G 4/258 361/310 |
| 3,879,645 A | | 4/1975 | Rutt et al. |
| 4,030,004 A | | 6/1977 | Rutt |
| 4,470,098 A | | 9/1984 | Alexander |
| 4,797,780 A | | 1/1989 | Moser et al. |
| 4,819,128 A | | 4/1989 | Florian et al. |
| 4,913,932 A | | 4/1990 | Moser et al. |
| 5,137,776 A | | 8/1992 | Kahn |

(Continued)

FOREIGN PATENT DOCUMENTS

| | | | | |
|---|---|---|---|---|
| JP | 2001332439 A | * | 11/2001 | ............... H01G 4/30 |
| WO | WO-2016178524 A1 | * | 11/2016 | ............... H01G 4/30 |

*Primary Examiner* — David M Sinclair

(74) *Attorney, Agent, or Firm* — Wood Herron & Evans LLP

(57) ABSTRACT

A monolithic ceramic capacitor has a plurality of dielectric layers and a plurality of conductive layers sintered together to form a substantially monolithic ceramic body. The ceramic body defines at least one void between the dielectric and conductive layers. The void is at least partially enclosed within the ceramic body and bounded by at least a portion of a dielectric layer, a first conductive layer, and a second conductive layer. Within the dielectric body, the first and second conductive layers are connected in a nonconductive manner.

18 Claims, 33 Drawing Sheets

(56) References Cited

U.S. PATENT DOCUMENTS

| | | | | |
|---|---|---|---|---|
| 5,295,289 | A * | 3/1994 | Inagaki | H01G 4/232 |
| | | | | 29/25.42 |
| 5,583,738 | A * | 12/1996 | Kohno | H01G 4/385 |
| | | | | 361/312 |
| 5,601,673 | A | 2/1997 | Alexander | |
| 5,606,486 | A * | 2/1997 | Moncrieff | H01G 4/20 |
| | | | | 29/25.42 |
| 6,775,124 | B2 * | 8/2004 | Cheung | H01G 4/02 |
| | | | | 361/301.4 |
| 6,816,356 | B2 | 11/2004 | Devoe et al. | |
| 8,885,324 | B2 * | 11/2014 | Bultitude | H01G 4/30 |
| | | | | 361/326 |
| 9,437,894 | B2 | 9/2016 | Devoe et al. | |
| 2002/0085334 | A1 * | 7/2002 | Figueroa | H01G 4/30 |
| | | | | 361/301.4 |
| 2009/0296294 | A1 * | 12/2009 | Liu | H01T 4/12 |
| | | | | 361/56 |
| 2013/0208395 | A1 * | 8/2013 | Bultitude | H01G 4/30 |
| | | | | 361/275.1 |
| 2015/0294792 | A1 * | 10/2015 | Schossmann | H01G 4/30 |
| | | | | 361/301.4 |
| 2015/0302989 | A1 * | 10/2015 | Choi | H01G 2/14 |
| | | | | 29/25.03 |
| 2018/0012706 | A1 * | 1/2018 | Bultitude | H01G 4/33 |
| 2018/0027656 | A1 * | 1/2018 | Jung | H01G 4/012 |
| | | | | 174/260 |
| 2018/0124904 | A1 * | 5/2018 | Cho | H01G 4/002 |

* cited by examiner

MULTILAYER BROADBAND CERAMIC CAPACITOR WITH INTERNAL AIR GAP CAPACITANCE

RELATED APPLICATIONS

This application is a continuation-in-part of U.S. application Ser. No. 15/942,987 filed Apr. 2, 2018, which is hereby incorporated by reference herein in its entirety.

FIELD OF THE INVENTION

The present invention relates to multilayer broadband capacitors and, more particularly, to forming a capacitance in an internal void in a multilayer ceramic capacitor.

BACKGROUND OF THE INVENTION

The development of integrated circuits has made it possible to place many circuit elements in a single semiconductor chip. Where part or all of the circuit is an analog circuit, such as a radio frequency transmitter or receiver, audio amplifier, or other such circuit, circuit design requires lumped elements that cannot be readily realized in monolithic integrated circuits. Capacitors in particular are frequently created as separate elements from the integrated circuit. The electronic device thus typically includes monolithic integrated circuits combined with external capacitors. For such applications, monolithic ceramic capacitors have been used.

Various monolithic ceramic structures have been developed to provide relatively small capacitors for highly integrated applications. Such structures, known as multilayer ceramic capacitors, are formed by stacking sheets of green tape or greenware, i.e., thin layers of a powdered ceramic dielectric material held together by a binder that is typically organic. Such sheets, typically, although not necessarily, of the order of five inches by five inches, can be stacked with additional layers, thirty to one hundred or so layers thick. After each layer is stacked, conductive structures are printed on top of the layer, to form internal plates that produce the desired capacitance. The stacked configuration is compressed and diced into individual components or devices. The compressed, individual devices are heated in a kiln according to a desired time-temperature profile, driving off the organic binder and sintering or fusing the powdered ceramic material into a monolithic structure. Each device is then dipped in conductive material to form end terminations for the internal conductive structures, suitable for soldering to a surface mount circuit board or gluing and wire bonding to a hybrid circuit.

Many wireless communications systems, including satellite, GPS, and cellular applications, as well as high speed processor applications, require capacitor technology that can accommodate high frequencies of operation. Telecommunications, in particular fiber optic applications, require wide frequency bands with optimum high frequency performance. Commonly-assigned, U.S. Pat. No. 6,816,356, issued on Nov. 9, 2004 to Devoe et al., the disclosure of which is incorporated herein, discloses an integrated capacitor array with a plurality of capacitors connected in series and/or parallel circuits in a substantially monolithic dielectric body. The integrated capacitor arrays disclosed in the '356 patent provide effective wideband performance by forming a parallel combination of a lower frequency, higher value capacitance with a higher frequency, lower value capacitance. As shown in FIG. 1, the integrated capacitance array 20 disclosed in the '356 patent includes both a multi-layer lower frequency, higher value capacitance section 22, and a higher frequency, lower value capacitance section 24. Overlapping conductive plates 30, 32 are connected to external conductive contacts 34, 36 respectively. External conductive plates 40, 42 facilitate mounting the capacitor to circuits on a printed circuit board. A capacitance is formed between the external plates 40, 42 based upon the fringe electric field extending to and from the adjacent edges of the plates due to the close spacing of the plate ends. The fringe effect capacitance provides a second, higher frequency, lower value capacitance that has a beneficial effect on the high frequency performance of the capacitor.

Ceramic dielectric materials with constants in the range of 2000-4000 provide bulk capacitance values in the nanofarad range. However, it has been determined that ceramic dielectric materials can actually inhibit optimum high frequency performance. Air has been determined to have better dielectric stability over the broadband frequency range 10 kHz-100 GHz as compared to a ceramic dielectric, such as, for example, X7R. The fringe effect capacitance between the external plates in the '356 patent provide an example of the capacitance that is possible with air as a dielectric medium. External air gap capacitors provide many benefits, but can be subject to uncertainty due to the changing atmosphere surrounding the air gap. Fillers or other materials may impact the air gap and alter the capacitance that can be achieved. Additionally, external air gap capacitors are limited to having air as the dielectric medium, as it is impossible to retain other gases due to the external nature of the gap.

It is known to have gaps or voids within a monolithic ceramic structure. Voids have previously been unintentionally formed within a dielectric body during production of an integrated capacitor array, due to failure of the materials before, during, or after the sintering process. Several examples of the unintentional formation of voids are illustrated in FIG. 2. In particular, a delamination void, indicated at 43, may be formed from the separation of a conductive layer 44 from the adjacent dielectric layer subsequent to the heating process. Air bubbles may also develop during the heating process and create voids, indicated at 45, within a dielectric layer. A void may also be created when heat during the sintering process causes a conductive layer 44 to shrink back from an end node, as depicted at 46. Inconsistencies in the greenware material, or simply the porosity of the green ceramic material itself may produce air gaps or voids, as indicated at 48, in one or more dielectric layers. Conventional thought has been that voids in the dielectric body are undesirable and, therefore, steps are taken during the manufacturing process to reduce or eliminate the presence of these voids. Traditionally the placement of these unintentional voids has been random and did not form a useable capacitance.

Accordingly, in order to accommodate high frequencies of operation it is desirable to have a multilayer broadband ceramic capacitor that utilizes the beneficial effects of air as a dielectric medium. In particular, it is desirable to have a capacitor with an air gap capacitance which provides for greater control over the high frequency performance of the capacitor. Further, it is desirable to have improved high frequency performance in a broadband capacitor array, while maintaining the size and cost efficiencies of existing monolithic capacitor arrays.

SUMMARY OF THE INVENTION

An integrated capacitor array having effective wideband performance is provided in a cost effective structure. The capacitor described herein includes capacitance formed in a ceramic dielectric material between conductive layers. The capacitor also includes at least one capacitance created in an internal void within the multilayer dielectric body. The internal void forms an air gap enabling a fringe electric field to be created between the edges of adjacent conductive layers. The void may comprise a vacuum, or be infused with air or other gases. The composition of the integrated capacitor array, including the number and location of internal voids, can be varied in order to tune the capacitor to a particular application.

According to one aspect, a monolithic ceramic capacitor is provided having a plurality of dielectric layers and a plurality of conductive layers sintered together to form a substantially monolithic ceramic body. The ceramic body defines at least one void between the dielectric and conductive layers. The void is at least partially enclosed within the ceramic body and bounded by at least a portion of a dielectric layer, a first conductive layer, and a second conductive layer. Within the dielectric body, the first and second conductive layers are connected in a nonconductive manner.

In a second aspect, a capacitor is provided having a substantially monolithic dielectric body. A plurality of conductive first layers are disposed within the dielectric body and electrically connected to a first conductive contact on the dielectric body. A plurality of conductive second layers are also disposed within the dielectric body and electrically connected to a second conductive contact on the dielectric body. The second layers are interleaved with the first layers to form capacitances between the layers. At least one additional conductive layer extends between the first and second conductive contacts. The additional conductive layer comprises first and second conductive plates separated by a void, the void at least partially enclosed by the dielectric body and bordered by at least a portion of a dielectric layer. Adjacent edges of the first and second conductive plates are spaced apart to form a nonconductive connection through the void.

In a third aspect, a method is provided for making a monolithic ceramic capacitor containing multiple capacitances, at least one capacitance being an air gap capacitance. The method includes providing a plurality of layers of a dielectric ceramic and a plurality of conductive layers. The method further includes stacking the conductive and dielectric layers in an interleaving fashion. The stacked layers are then sintered to form a monolithic ceramic body. A void is formed in the monolithic ceramic body before or during the sintering process. The void is formed so as to be bounded by at least a portion of a dielectric layer and portions of a first conductive layer and a second conductive layer. The first and second conductive layers are spaced apart relative to the void to form a nonconductive connection between the layers.

BRIEF DESCRIPTION OF THE DRAWINGS

The present disclosure will be more readily understood from a detailed description of some example embodiments taken in conjunction with the following figures.

DETAILED DESCRIPTION

Various non-limiting embodiments will now be described to provide an overall understanding of the principles of the structure, function, and use of the integrated broadband capacitor arrays disclosed herein. One or more examples of these non-limiting embodiments are illustrated in the accompanying drawings. Those of ordinary skill in the art will understand that apparatus and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure.

In the presently disclosed embodiments, the integrated multilayer capacitor has a substantially monolithic dielectric body formed from a plurality of ceramic tape layers laminated together in a green state, and fired to form a sintered or fused monolithic ceramic structure. The dielectric and conductive materials and assembly methods disclosed herein are exemplary, and other materials and methods may be used. In the disclosed embodiments the dielectric body has a hexahedral shape with electrical contacts positioned on opposite end surfaces. However, other shapes may also be used. In the embodiments described below, at least one void is intentionally formed, at least partially within the ceramic monolithic body before, during, and/or after the sintering process. The one or more voids are formed between adjacent overlapping conductive layers, or between the exposed ends of conductive layers, or both, in order to produce additional high frequency capacitance in the capacitor. Air or other gas present in the one or more voids serves as a dielectric medium, enabling a fringe effect capacitance to form between the conductive layers.

Figure 1:
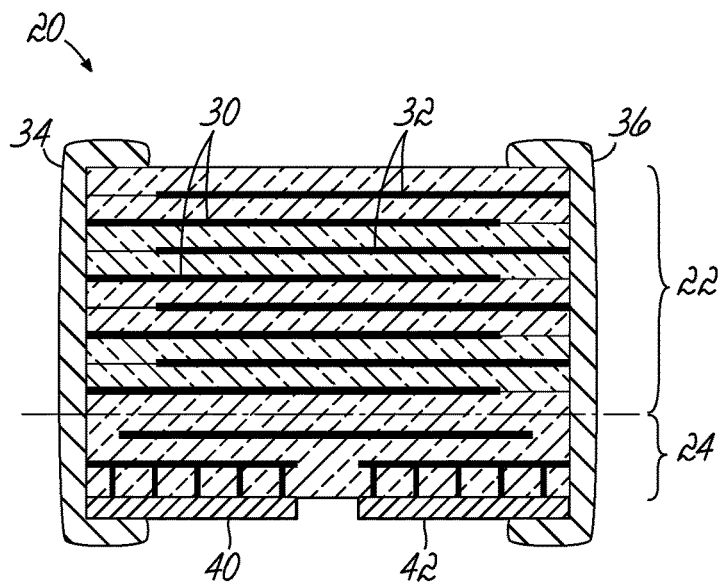
FIG. 1 illustrates a known integrated multilayer capacitor structure.
Figure 2:
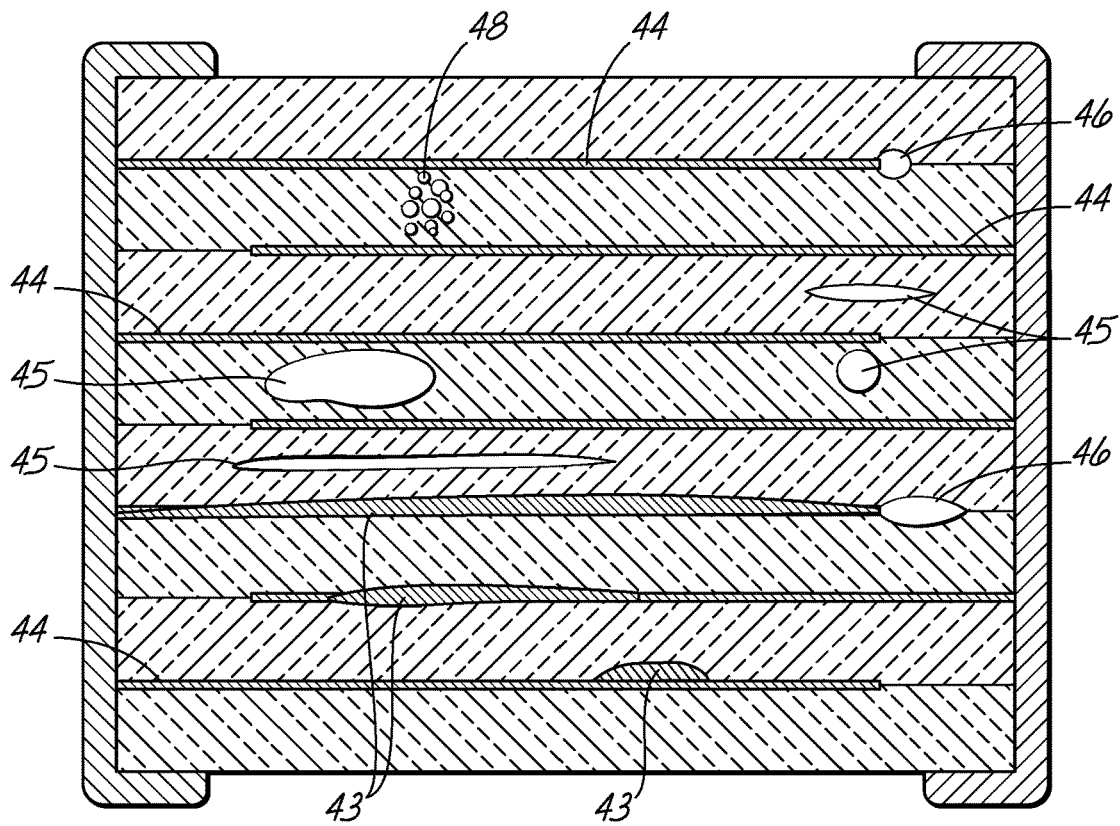
FIG. 2 is a schematic depiction of known examples of unintentional voids in a monolithic ceramic capacitor.
Figure 3A:
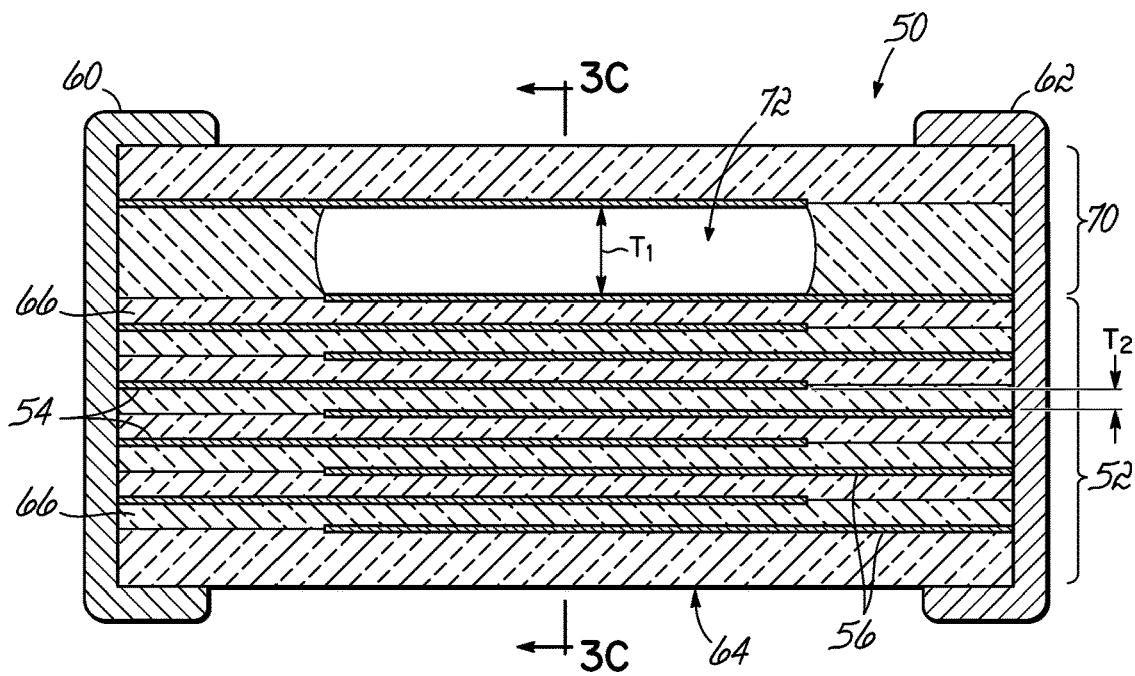
FIG. 3A illustrates a first embodiment of an integrated multilayer capacitor with a single internal void high frequency capacitance.

Referring now to FIG. 3A, a first embodiment of an integrated multilayer capacitor with an internal air gap capacitance will be described. In this embodiment, the capacitor 50 includes a plurality of conductive layers 54 extending individually from a conductive contact 60 on a first side of a ceramic dielectric body 64. A second plurality of conductive layers 56 extend individually from a conductive contact 62 on a second, opposite side of the dielectric body 64. The conductive layers 54, 56 are alternately stacked with layers 66 of a dielectric material to form a six-sided, integrated multilayer structure. The conductive material 60, 62 at each end of the dielectric body 64 forms a common connection point for each layer 54, 56 extending to that side. In this embodiment, the individual layers 54, 56 extend from side contacts 60, 62 in an interleaving fashion such that at least a portion of the two layers overlap in a vertical direction. The layers 54, 56 are disposed at an orientation that is substantially parallel to a longitudinal centerline of the dielectric body 64. Using single interleaved conductive layers 54, 56 increases the series inductance and resistance of the integrated capacitor array; however, this configuration enables more layers to be included in the capacitor, allowing an increase in capacitance value.

In this embodiment, the interleaving conductive and dielectric layers are closely spaced in the lower portion of the dielectric body 64 to create a lower frequency, higher value capacitance section 52. The upper two interleaving layers are more widely spaced to form a higher frequency capacitance in an upper section 70 of the dielectric body 64. The high frequency capacitance is formed by a void 72 located between the upper two overlapping conductive layers. Void 72 is wholly enclosed within the dielectric body 64 between the conductive layers 54, 56, and at least a portion of a dielectric layer 66. The conductive layers 54, 56 are spaced apart so as to have a nonconductive connection therebetween. In particular, the void 72 has a depth sufficient to prevent an electrical current from moving between the conductive layers 54, 56, while enabling the creation of an electric field in the void due to the opposite charges on the layers. As illustrated in FIGS. 3A and 3C, the spacing $T_1$ between the overlapping conductive layers 54, 56 bordering the void 72 is substantially greater than the spacing $T_2$ between adjacent conductive layers 54, 56 in the lower frequency section 52 of the capacitor 50. The larger spacing $T_1$ between the conductive layers bordering the void 72 prevents a short circuit from forming between the layers. Spacing $T_1$ will typically be in the range of 10 microns to 200 microns, while the spacing $T_2$ will typically be in the range of 2 microns to 10 microns. The longitudinal length of the void 72 may be varied in order to increase or decrease the overlap between the conductive layers 54, 56. Varying the length of overlap between the conductive layers 54, 56 will change the capacitance created within the void 72.

Figure 3B:
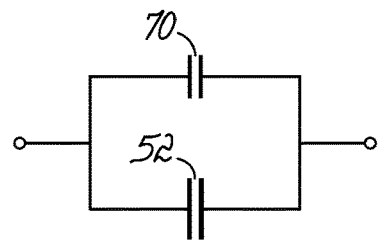
FIG. 3B illustrates an equivalent circuit diagram for the capacitor of FIG. 3A.
Figure 3C:
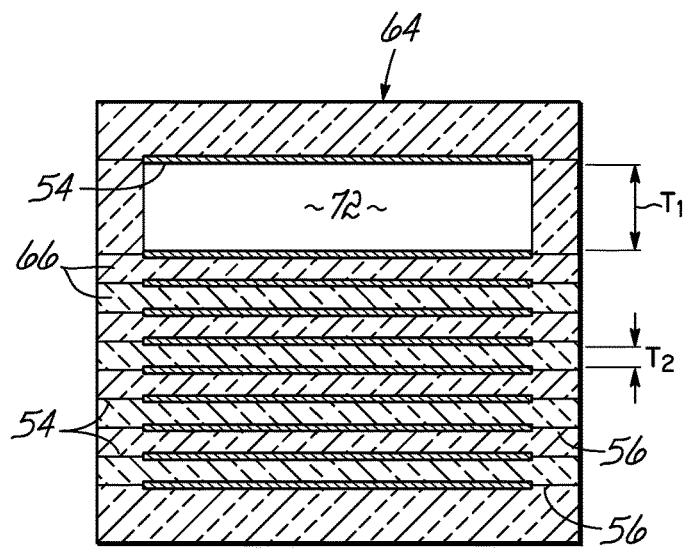
FIG. 3C is an end sectional view taken along line 3C-3C of FIG. 3A.

Referring to FIG. 3B, the equivalent circuit diagram of operative capacitances in the device of FIG. 3A includes the low frequency, high value capacitor 52 and the high frequency, low value capacitor in upper section 70. The void 72 in this embodiment is placed off center, allowing for asymmetric surface mounting of the capacitor 50 on a circuit board. The high frequency performance may be tuned by altering the separation distance between the adjacent conductive layers 54, 56, and/or the degree of overlap between the conductive layers.

Figure 4A:
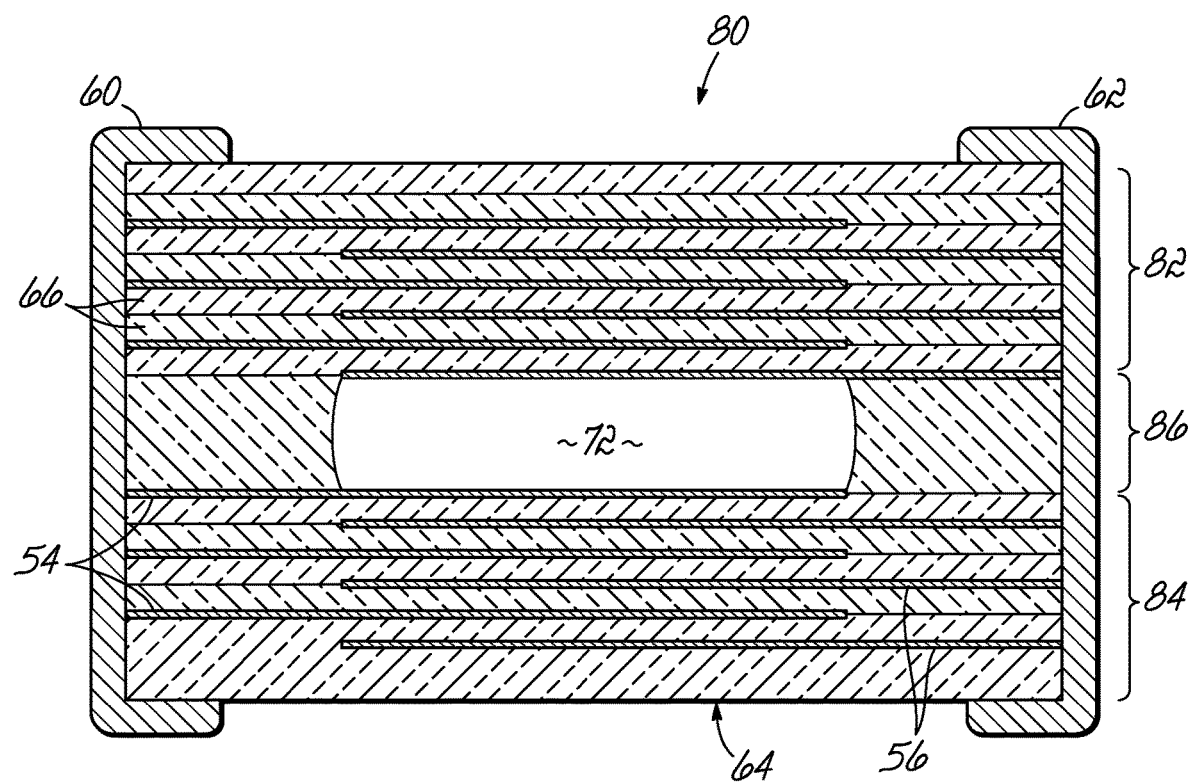
FIG. 4A illustrates a second embodiment of an integrated multilayer capacitor with a single internal void high frequency capacitance.
Figure 4B:
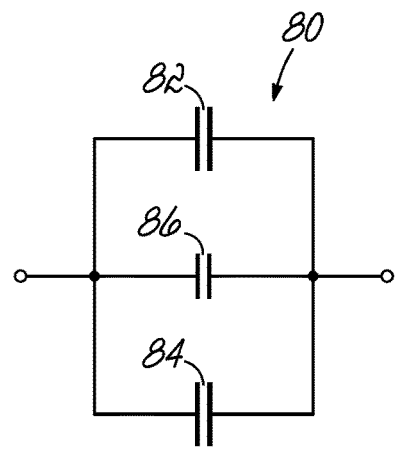
FIG. 4B illustrates an equivalent circuit diagram.

FIG. 4A shows a second embodiment for an integrated multilayer capacitor. In this embodiment, the capacitor 80 includes both upper and lower high value, low frequency capacitances 82, 84. The capacitance sections 82, 84 include closely-spaced, interleaved conductive layers 54, 56 extending from conductive contacts 60, 62 on opposite sides of a dielectric body 64. A void 72 is formed in the center of the dielectric body 64 between overlaying conductive layers 54, 56. The void 72 between conductive layers 54, 56 forms a low value, high frequency capacitance 86. In this embodiment, the spacing between the conductive layers 54, 56 bordering the void 72 is substantially greater than the spacing between the conductive layers in the low frequency sections 82, 84, as in the previous embodiment, in order to prevent electrical conduction, and thus a short circuit, between the layers. FIG. 4B illustrates an equivalent circuit diagram of operative capacitances in the device of FIG. 4A. The capacitances include high value capacitors 82, 84 connected across a lower value, higher frequency capacitor 86. The void 72 in this embodiment is placed in the center of the dielectric body 64, thereby locating the high frequency capacitance between the lower frequency capacitances, and allowing for symmetric surface mounting of the capacitor on a circuit board.

Figure 5A:
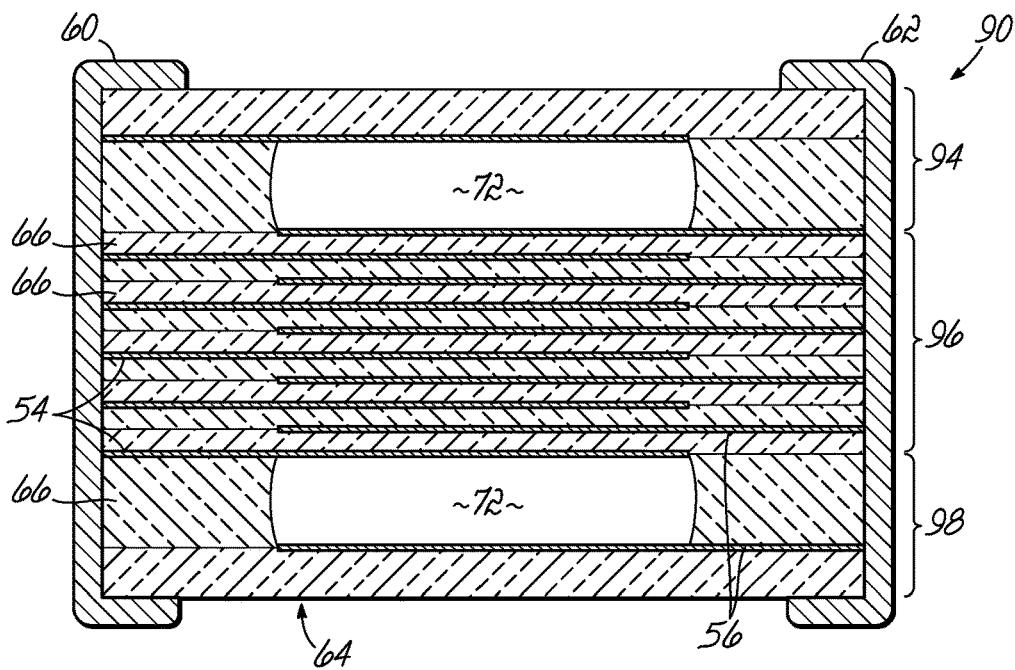
FIG. 5A illustrates a third embodiment of an integrated multilayer capacitor with two internal void high frequency capacitances.

FIG. 5A illustrates a third embodiment for an integrated multilayer capacitor. In this embodiment, the capacitor 90 includes a low frequency, high value capacitance 96 centered between upper and lower high frequency, low value capacitances 94, 98. High value capacitance 96 includes closely-spaced, interleaved conductive layers 54, 56 extending from conductive contacts 60, 62 on opposite sides of a dielectric body 64. The interleaving conductive layers 54, 56 are spaced apart by dielectric layers 66. The high frequency capacitances 94, 98 each include overlapping conductive layers 54, 56 bordering a void 72 as in the previous embodiments. The overlapping layers 54, 56 are spaced apart by void 72 a sufficient distance to prevent electrical conduction between the layers, but sufficiently close to create an electric field within the void between the oppositely charged layers. FIG. 5C illustrates an equivalent circuit diagram of operative capacitances in the device of FIG. 5A. The capacitances include high value, low frequency capacitor 96 connected between a pair of lower value, high frequency capacitors 94, 98. The voids 72 in this embodiment are symmetrically placed in the upper and lower portions of the dielectric body 64, thereby allowing for symmetric surface mounting of the capacitor 90 on a circuit board.

Figure 5B:
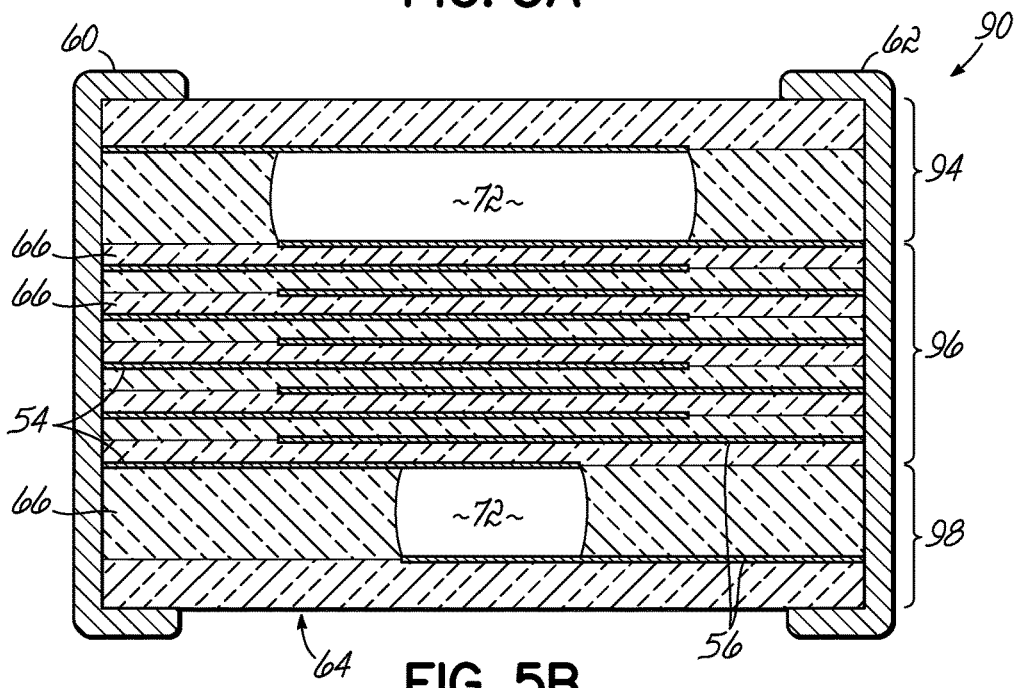
FIG. 5B illustrates an alternative embodiment of the integrated multilayer capacitor of FIG. 5A, in which the two internal voids differ in longitudinal length.
Figure 5C:
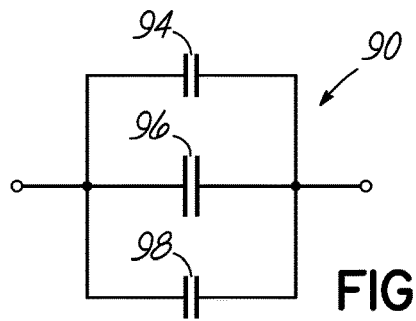
FIG. 5C illustrates an equivalent circuit diagram.
Figure 5D:
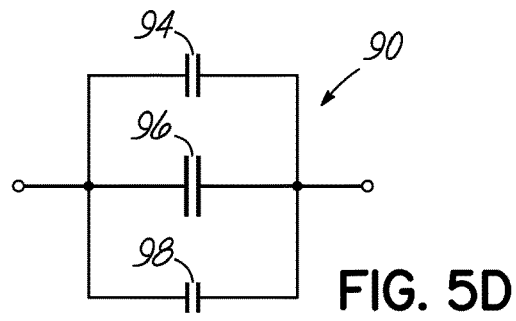
FIG. 5D illustrates an equivalent circuit diagram.

FIG. 5B illustrates an alternative embodiment of the integrated multilayer capacitor of FIG. 5A. In this alternative embodiment, the longitudinal lengths of the voids differ. The void 72' depicted in this embodiment has a longitudinal length that is of a smaller magnitude than that of the void 72, though alternative arrangements (e.g., a longitudinal length that is of a larger magnitude) may be used as well. By varying the longitudinal length of the voids 72, 72', the overlap between the conductive layers 54, 56 also differs. Accordingly, the capacitances 94, 98 created within the voids 72, 72' also differ. This is exemplified by capacitor 98 having a lower value and higher frequency than capacitor 98. FIG. 5D illustrates an equivalent circuit diagram of operative capacitances in the device of FIG. 5B.

Figure 6A:
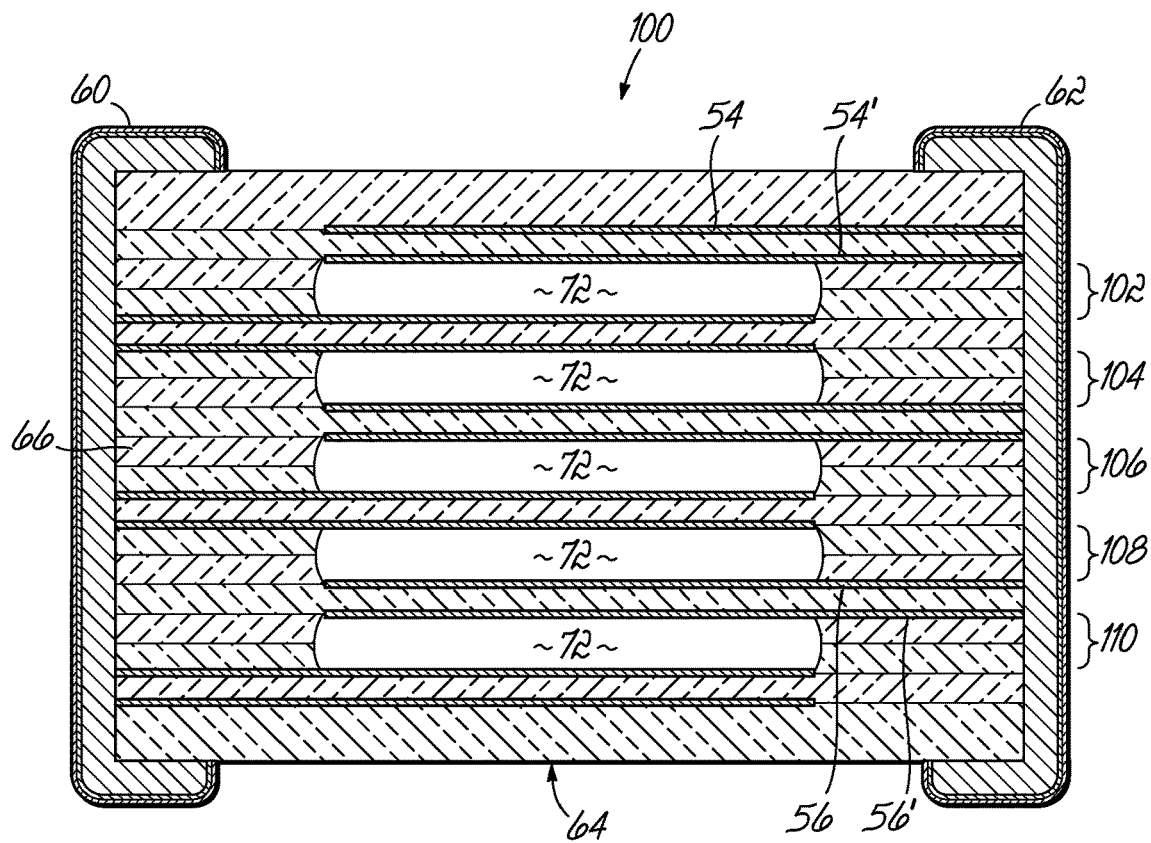
FIG. 6A illustrates a fourth embodiment of an integrated multilayer capacitor with a series of internal void high frequency capacitances.
Figure 6B:
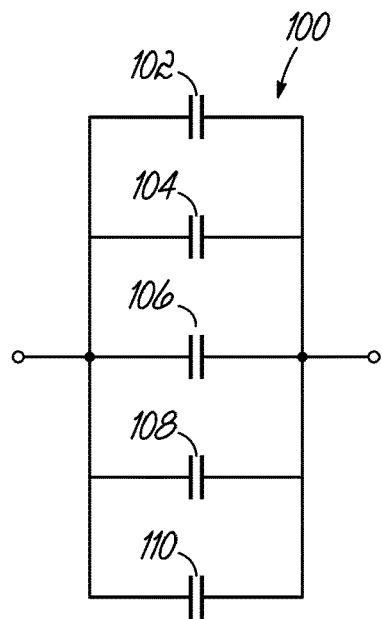
FIG. 6B illustrates an equivalent circuit diagram.

FIG. 6A illustrates a fourth embodiment for an integrated multilayer capacitor. In this embodiment, the capacitor 100 includes pairs of parallel layers 54, 54' and 56, 56' extending from conductive contacts 60, 62 on opposite sides of the dielectric body 64. Using parallel layers 54, 54' and 56, 56', rather than single interleaved layers, reduces the equivalent series resistance and inductance of the capacitor. Capacitor 100 also includes a series of internal voids 72 formed between adjacent conductive layers. In particular, from the top of FIG. 6A, a first capacitance 102 is formed between the second and third overlapping layers, a second capacitance 104 is formed between the fourth and fifth overlapping plates, a third capacitance 106 is formed between the sixth and seventh overlapping plates, a fourth capacitance 108 is formed between the eighth and ninth overlapping plates, and a fifth capacitance 110 is formed between the tenth and eleventh overlapping plates. Each of the capacitances 102-110 is bordered by the overlapping plates and on the sides by a portion of at least one dielectric layer in which the void 72 is formed. The individual capacitances 102-110 are also separated by at least one additional dielectric layer within the capacitor stack. The multiple capacitances formed within the stacked internal voids allow for a higher total capacitance value for the capacitor 100. FIG. 6B illustrates an equivalent circuit diagram of operative capacitances in the device of FIG. 6A. The circuit comprises a parallel combination of the multiple high frequency capacitances 102-110.

Figure 7A:
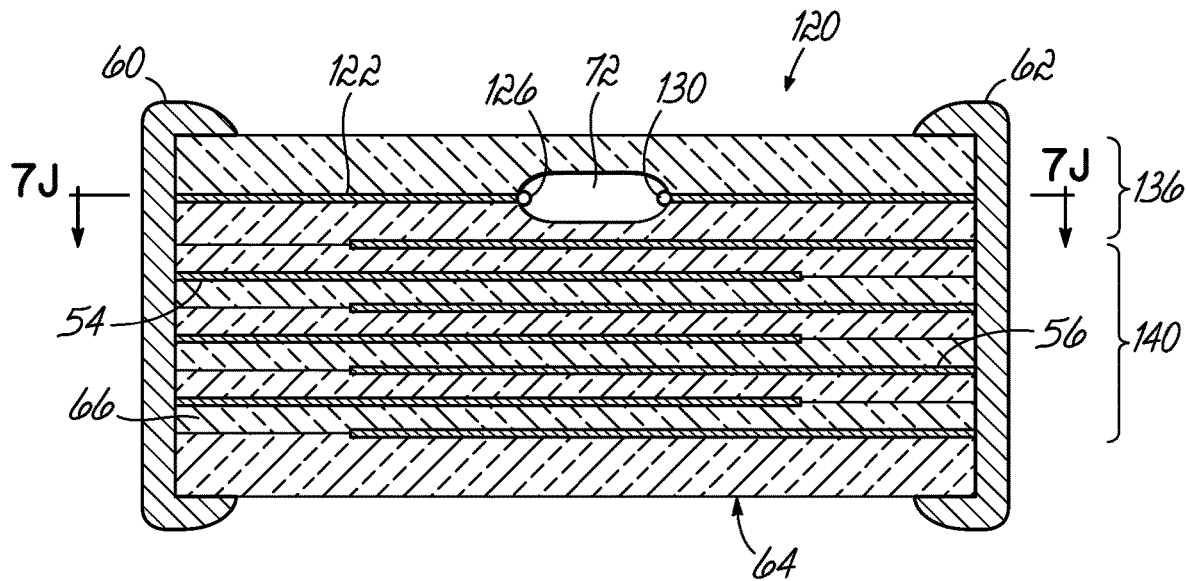
FIG. 7A illustrates a fifth embodiment of an integrated multilayer capacitor with a single internal void high frequency capacitance formed between exposed edges of conductive plates.
Figure 7B:
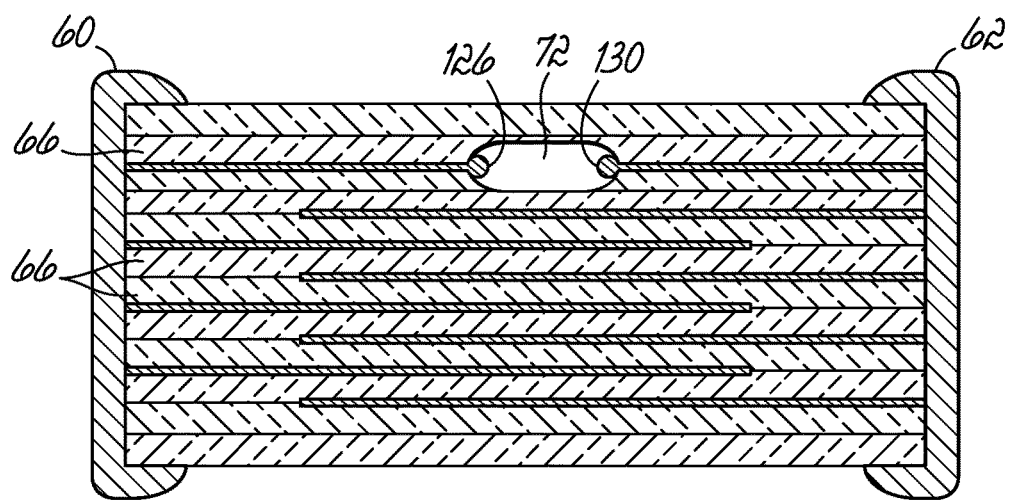
FIG. 7B depicts the capacitor of FIG. 7A, with the internal void formed by melting a fugitive material.
Figure 7C:
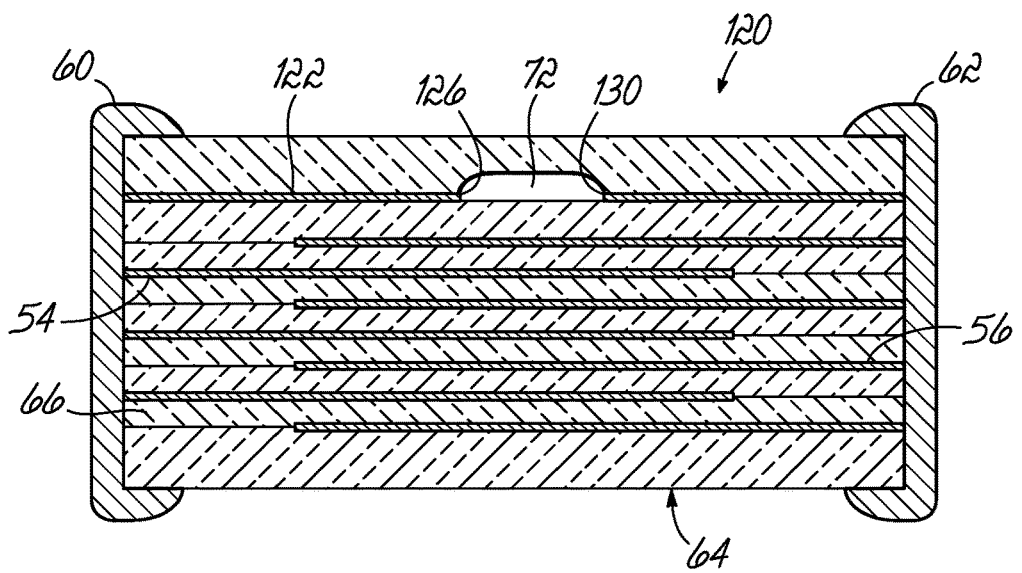
FIG. 7C illustrates an alternative embodiment for the integrated multilayer capacitor of FIG. 7A, in which a void is formed in a single dielectric layer.
Figure 7D:
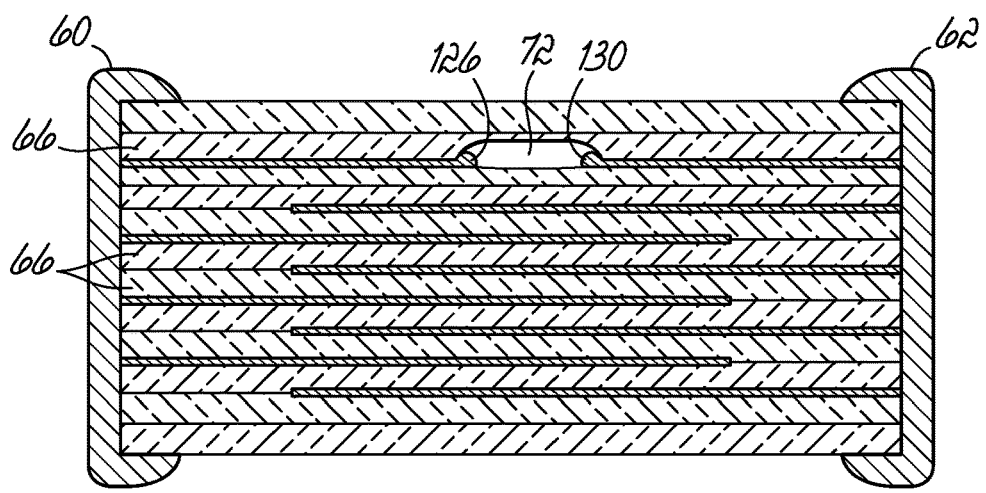
FIG. 7D illustrates the integrated multilayer capacitor of FIG. 7C with sintered conductive plate edges.
Figure 7E:
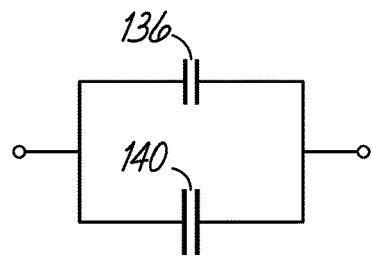
FIG. 7E illustrates an equivalent circuit diagram for the capacitor of FIG. 7A.
Figure 7F:
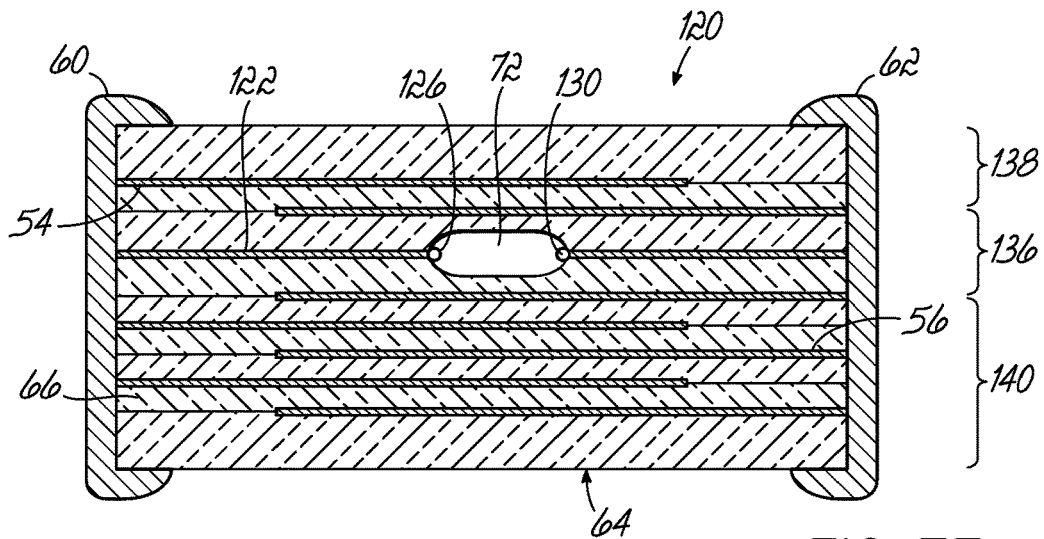
FIG. 7F illustrates an alternative embodiment for the integrated multilayer capacitor of FIG. 7A, in which the void is in an alternative arrangement.
Figure 7G:
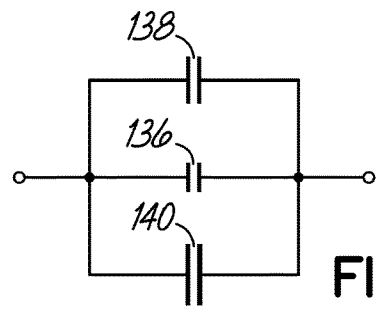
FIG. 7G illustrates and equivalent circuit diagram.
Figure 7H:
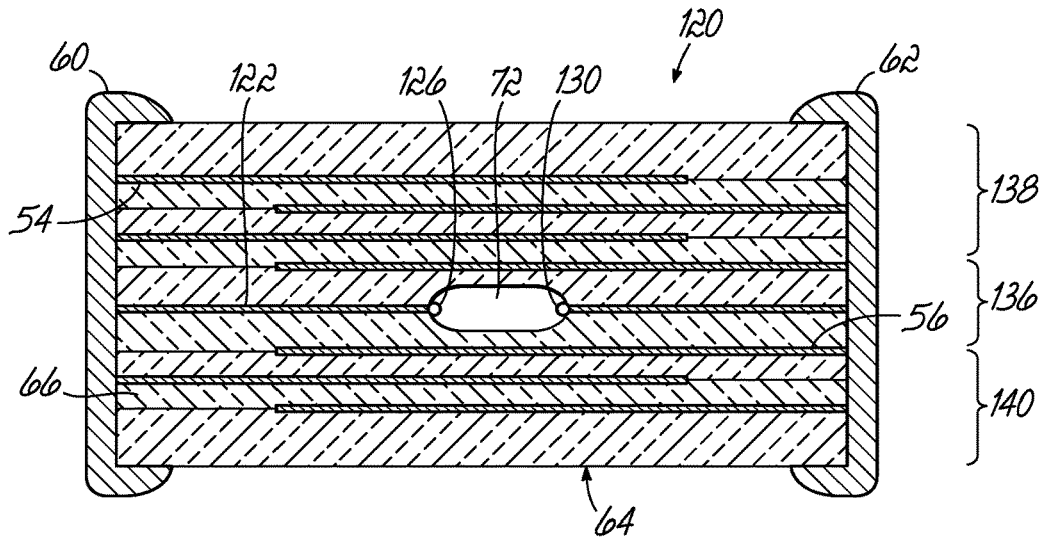
FIG. 7H illustrates an alternative embodiment for the integrated multilayer capacitor of FIG. 7A, in which the void is in an alternative arrangement.

FIGS. 7A through 7L illustrate a fifth embodiment for an integrated, multilayer broadband capacitor. In this embodiment, the capacitor 120 includes a plurality of conductive layers 54 extending individually from a conductive contact 60 on a first side of a ceramic dielectric body 64. A second plurality of conductive layers 56 extend individually from a second conductive contact 62 on the opposite side of the dielectric body 64. The conductive layers 54, 56 are alternately stacked with layers 66 of a dielectric material to form a six-sided, integrated structure. In this embodiment, an additional conductive layer 122 is connected to both conductive contacts 60, 62 and extends between opposite sides of the dielectric body 64. A section of the conductive layer 122 is removed to form a gap or void 72 in the conductive layer and surrounding dielectric material. The void 72 separates the conductive layer 122 into first and second conductive plates with spaced apart, oppositely charged edges 126, 130. The void 72 is additionally bounded by at least one dielectric layer. In the embodiment shown in FIGS. 7A and 7B, the void 72 is formed into both upper and lower dielectric layers, however alternative embodiments may include a void formed into only an upper dielectric layer (e.g., FIGS. 7C and 7D) or a lower dielectric layer. As depicted in FIGS. 7C and 7D, the void 72 formed of a single dielectric layer has a smaller area than the void in FIGS. 7A and 7B. Additionally, the void 72 may be positioned at different locations within the capacitor 120. FIGS. 7F and 7H illustrate alternative embodiments where the void 72 is positioned amongst a plurality of conductive layers 54, 56 in the dielectric body 64.

Different methods may be utilized to form the void 72. FIG. 7A depicts the capacitor with the void 72 formed by drilling. FIG. 7B depicts the capacitor with the void 72 formed by melting a fugitive material during the fabrication process to form nubs at the edges 126, 130 of the conductive layers. These methods of forming a void 72 in a dielectric body 64 will be described in more detail below.

Figure 7I:
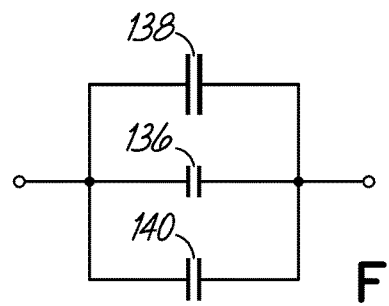
FIG. 7I illustrates and equivalent circuit diagram.
Figure 7J:
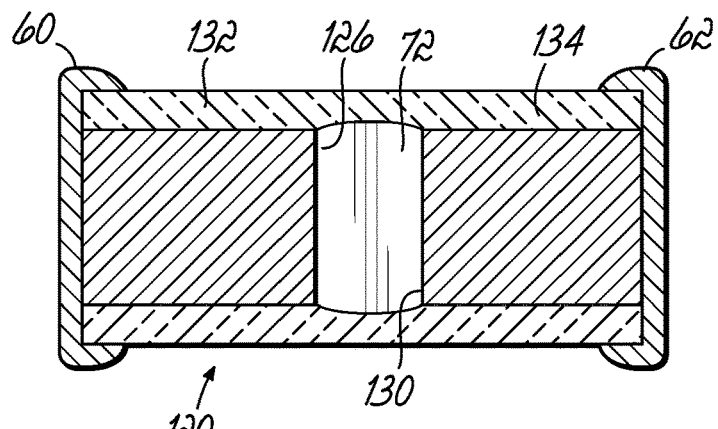
FIG. 7J is a top sectional view of the capacitor of FIG. 7A, taken along line 7J-7J of FIG. 7A.
Figure 7K:
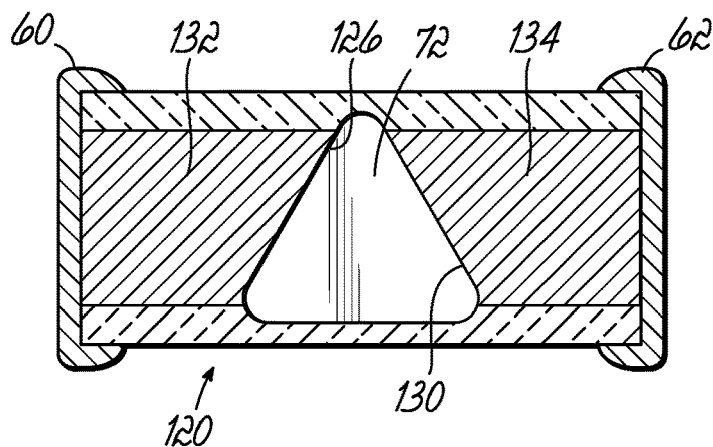
FIG. 7K is a top sectional view of an alternative embodiment of FIG. 7A, taken along line 7J-7J of FIG. 7A, in which the void is in a triangular shape.
Figure 7L:
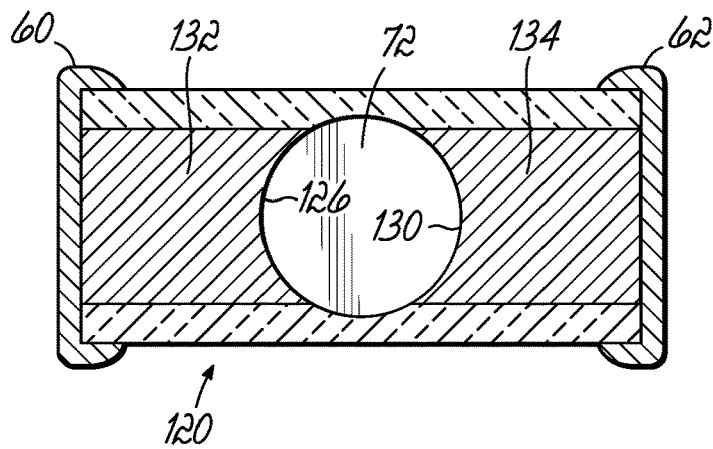
FIG. 7L is a top sectional view an alternative embodiment of FIG. 7A, taken along line 7J-7J of FIG. 7A, in which the void is in a circular shape.

As shown in FIGS. 7E and 7J, the void 72 forms an air gap that prevents conduction between the plates 132, 134, but allows for a fringe effect capacitance 136 between the adjacent edges 126, 130 of the oppositely charged plates. The top sectional view of FIG. 7J depicts the void 72 in a rectangular shape, however alternative embodiments may utilize a different shape for the void 72. FIGS. 7K and 7L illustrate top sectional views where the void 72 is triangular and circular, respectively. In addition to the air gap capacitance 136, additional capacitance may be formed in capacitor 120 between the overlapping conductive layers 54, 56 of the dielectric body 64. Depending on the position of the void 72 relative to the overlapping conductive layers 54, 56, more than one additional capacitance may be formed. Exemplary embodiments include, but are not limited to, positioning the void 72 at the top of the upper portion (FIGS. 7A-7D), towards the upper portion (FIG. 7F), or towards the center portion (FIG. 7H) of the dielectric body 64. FIG. 7E illustrates an equivalent circuit diagram of operative capacitances in the devices of FIGS. 7A-D, including a low frequency, higher value capacitor 140, and the high frequency, lower value capacitor 136. Also, FIG. 7G illustrates an equivalent circuit diagram of the operative capacitances in the alternative embodiment of FIG. 7F, including a lower frequency, higher value capacitor 140, a low frequency, high value capacitor 138, and higher frequency, lower value capacitor 136. Lastly, FIG. 7I illustrates an equivalent circuit diagram of the operative capacitances in the alternative embodiment of FIG. 7H, including a lower frequency, higher value capacitor 138, a low frequency, high value capacitor 140, and higher frequency, lower value capacitor 136. As in the first embodiment illustrated in FIG. 3A, the void 72 in these embodiments are placed off center, allowing for asymmetric surface mounting of the capacitor on a circuit board.

Figure 8A:
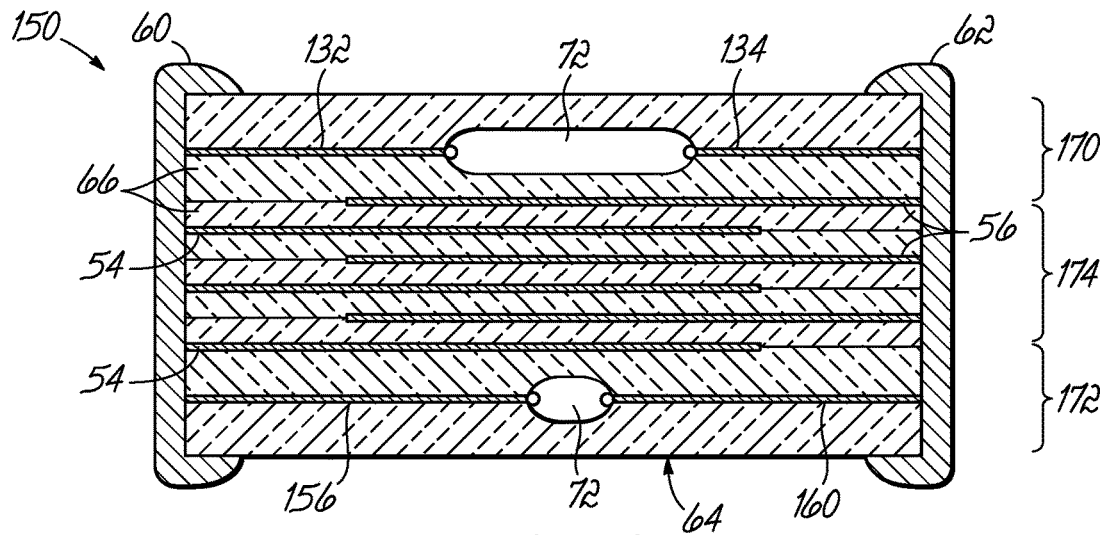
FIG. 8A illustrates a sixth embodiment of an integrated multilayer capacitor with a pair of internal void high frequency capacitances formed between exposed edges of conductive plates, in which the pair of internal void high frequency capacitances differ in magnitude.
Figure 8B:
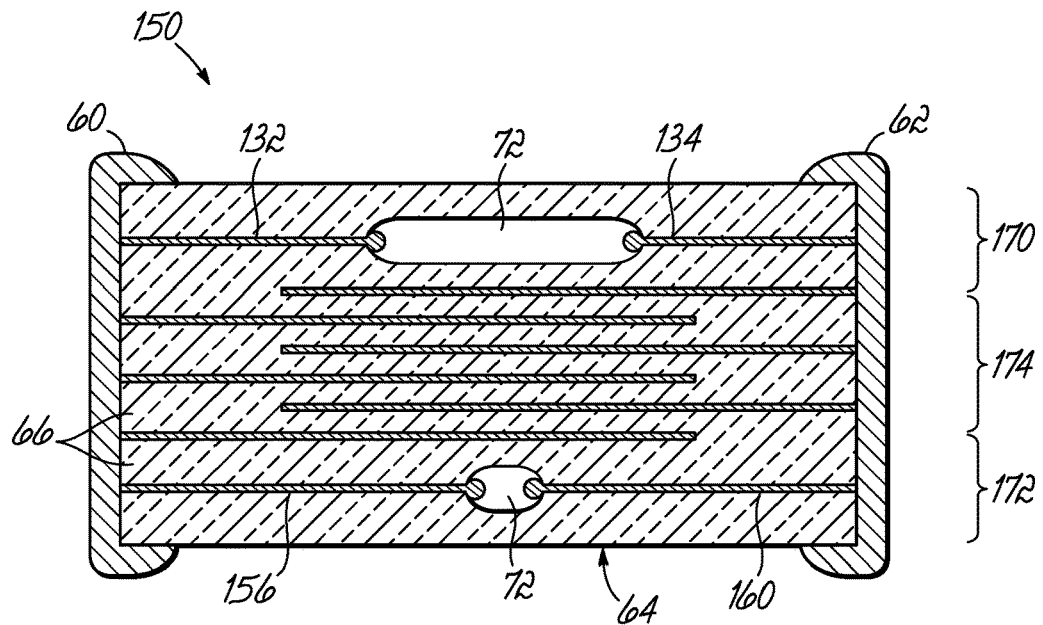
FIG. 8B depicts the capacitor of FIG. 8A, with the pair of internal voids formed by melting a fugitive material.
Figure 8C:
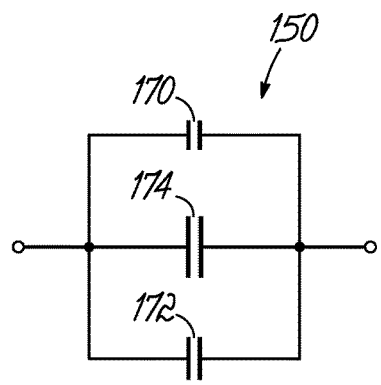
FIG. 8C illustrates an equivalent circuit diagram for the capacitor of FIG. 8A.
Figure 8D:
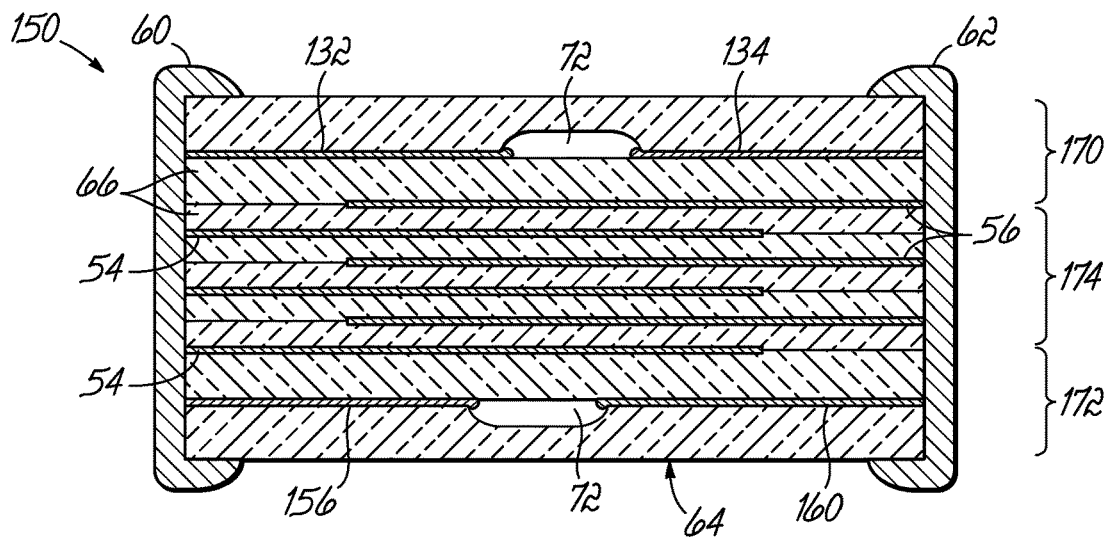
FIG. 8D illustrates an alternative embodiment for the integrated multilayer capacitor of FIG. 8A, in which a void is formed in a single dielectric layer.
Figure 8E:
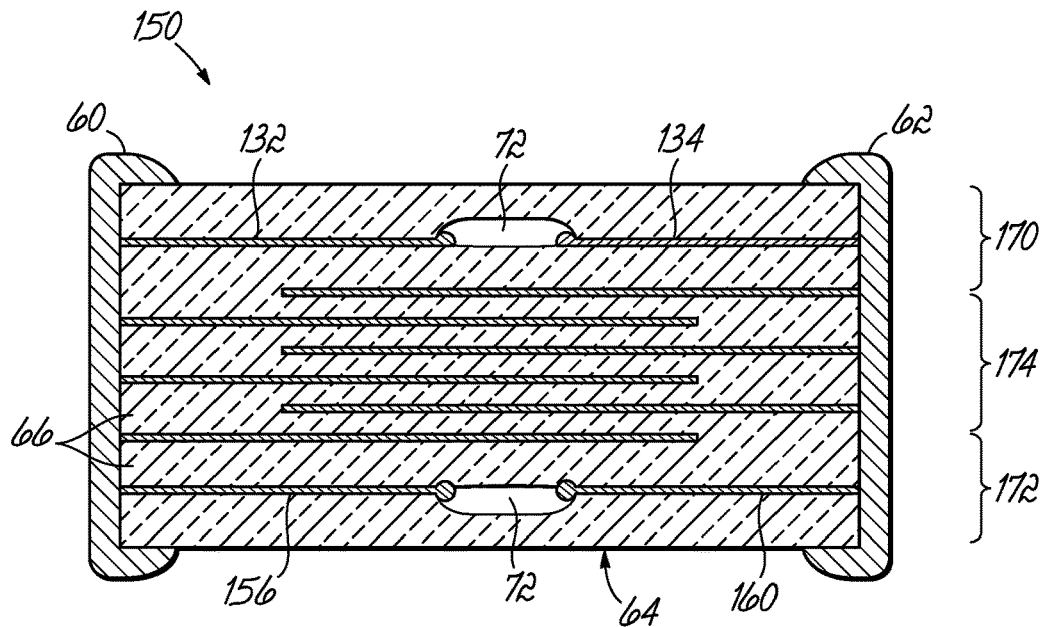
FIG. 8E illustrates the integrated multilayer capacitor of FIG. 8D with sintered conductive plate edges.
Figure 8F:
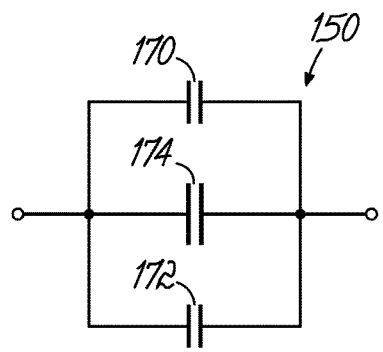
FIG. 8F illustrates an equivalent circuit diagram for the capacitor of FIG. 8D.

FIGS. 8A through 8C illustrate yet another alternative embodiment for an integrated multilayer capacitor, in which the capacitor 150 includes additional upper and lower conductive layers extending between conductive contacts 60, 62, on opposite sides of the dielectric body 64. In this embodiment, a pair of high frequency air gap capacitances are formed by removing a portion of each of the additional layers to form pairs of conductive, coplanar plates 132, 134 and 156, 160 with exposed edges. Voids 72, 72' are formed within the dielectric material between the exposed edges of the conductive plates. The voids 72, 72' are located wholly within the dielectric body 64 and bounded by upper and lower dielectric layers. As in the previous embodiments, the spacing between the exposed plate edges prevents a short circuit from existing between the conductive contacts 60, 62. The oppositely charged exposed edges of the plates 132, 134 and 156, 160 create fringe effect capacitances 170, 172 within the voids 72, 72'. In addition to the air gap capacitances 170, 172, an additional capacitance 174 may be formed in capacitor 150 between the overlapping conductive layers 54, 56 in the dielectric body 64. FIG. 8A depicts the capacitor with the voids 72, 72' formed by drilling. FIG. 8B depicts the capacitor with the voids 72, 72' formed by melting a fugitive material. The methods of forming the voids in the dielectric body 64 will be described in more detail below. FIG. 8C illustrates an equivalent circuit diagram of operative capacitances in the devices of FIGS. 8A and 8B, including a low frequency, high value capacitor 174 in the middle of the capacitor 150, a high frequency, low value capacitor 172, and a higher frequency, lower value capacitor. The voids 72, 70' in this embodiment are symmetrically positioned relative to the center of the capacitor, allowing for symmetric surface mounting of the capacitor on a circuit board. FIGS. 8D and 8E illustrate an alternative embodiment of the capacitors shown in FIGS. 8A-8C. This alternative embodiment includes two additional conductive layers 122 connected to both conductive contacts 60, 62 so as to extend between opposite sides of the dielectric body 64. A section of each conductive layer 122 is removed to form a gap or voids 72 in the conductive layers and surrounding dielectric material. The voids 72 separate the conductive layers 122 into first and second conductive plates with spaced apart, oppositely charged edges 126, 130 which are bounded by upper and lower dielectric layers. In this embodiment, each void 72 is formed into only one of the bordering dielectric layers, with the upper internal void capacitance being formed in the upper dielectric layer, and the lower internal void capacitance being formed in the lower dielectric layer. The voids 72 shown in FIGS. 8D and 8E have a smaller area than the voids in FIGS. 8A and 8C, altering the capacitance formed within the void. FIG. 8F illustrates an equivalent circuit diagram of operative capacitances in the devices of FIGS. 8D and 8E, including a low frequency, high value capacitor 174 in the middle of the capacitor 150, and a pair of high frequency, lower value capacitors 170, 172.

Figure 9A:
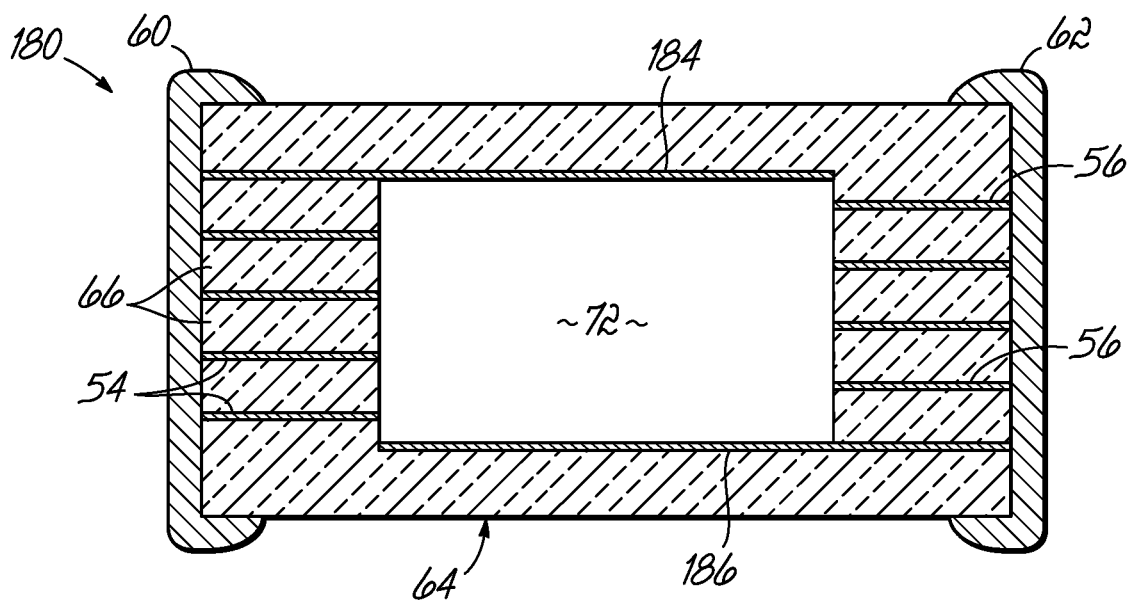
FIG. 9A illustrates a seventh embodiment of an integrated multilayer capacitor with an internal void high frequency capacitance.
Figure 9B:
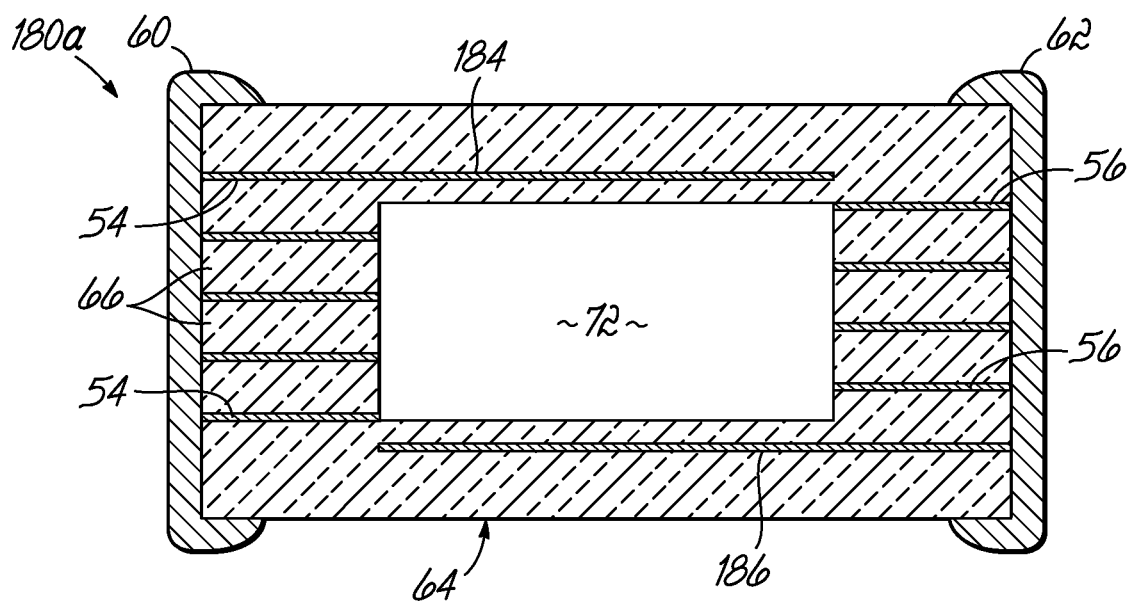
FIG. 9B illustrates an alternative embodiment for the integrated multilayer capacitor of FIG. 9A, in which dielectric layers form the upper and lower borders of the void.

FIGS. 9A and 9B illustrate additional alternative embodiments for a capacitor with an internal void 72 wholly enclosed within a dielectric body 64. In the first capacitor 180, shown in FIG. 9A, the void 72 encompasses multiple exposed edges of conductive layers 54, 56, as well as top and bottom overlapping conductive layers 184, 186. A capacitance is formed in the void 72 from the combined fringe electric fields from both the exposed plate edges and the overlapping conductive layers 184, 186. In the capacitor 180a shown in FIG. 9B, the void 72 is formed in substantially the same manner as the capacitor 180, with the addition of a thin layer of dielectric material between each of the overlapping conductive layers 184, 186 and the void. The additional dielectric material bordering the upper and lower edges of the void 72 decreases the capacitance created within the void by the oppositely charged overlapping layers 184, 186.

Figure 10A:
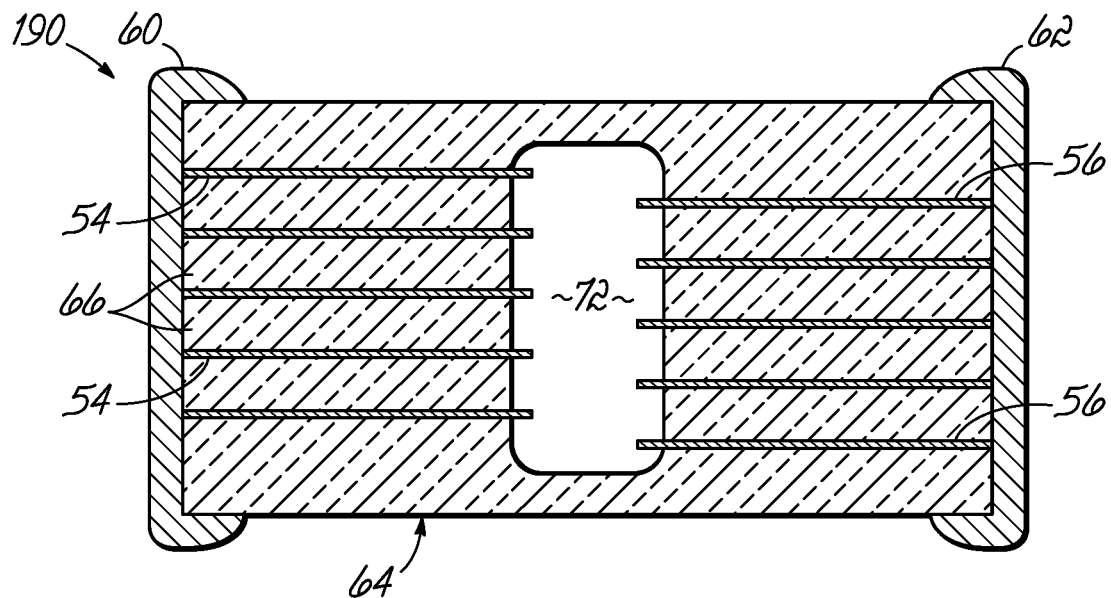
FIG. 10A illustrates an eighth embodiment of an integrated multilayer capacitor with an internal void high frequency capacitance formed between exposed edges of multiple conductive plates.
Figure 10B:
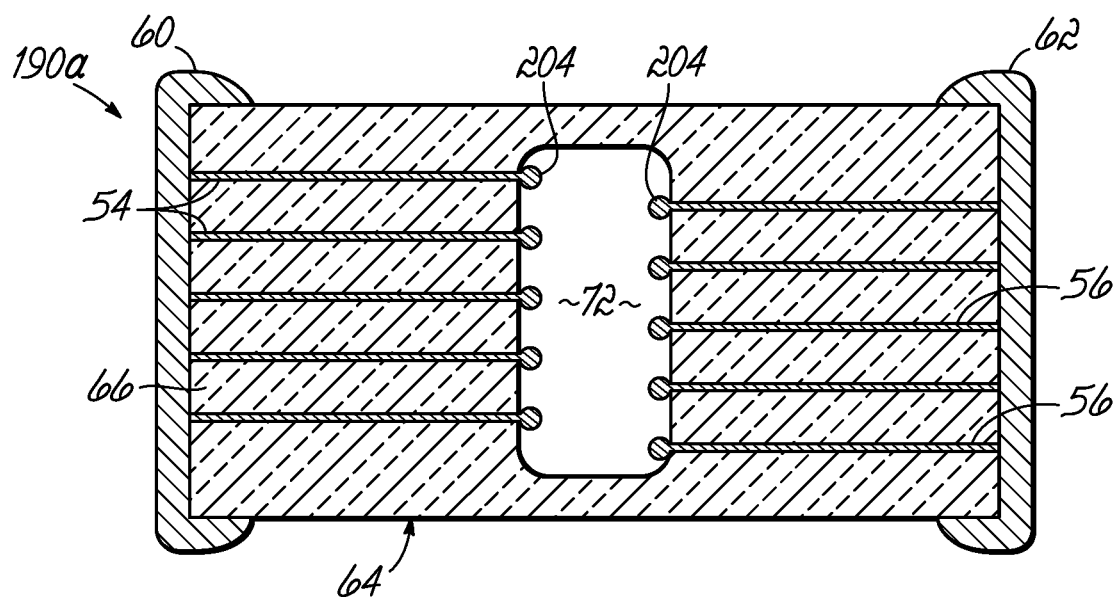
FIG. 10B illustrates the capacitor of FIG. 10A, manufactured using a melt-back process.

FIGS. 10A and 10B illustrate additional alternative embodiments for a capacitor with an internal void 72 wholly enclosed within a dielectric body 64. In this embodiment, the void 72 encompasses multiple exposed edges of conductive layers 54, 56, as in the previous embodiment, but does not include upper and lower overlapping conductive layers. A high frequency capacitance is formed in the void 72 from the combined effect of the fringe electric fields from the exposed edges of the plates 54, 56. FIG. 10A depicts a capacitor 190 with the void 72 formed by drilling, while FIG. 10B depicts a capacitor 190a with the void 72 formed by melting a fugitive material to form nubs 204 at the exposed ends of the conductive layers 54, 56.

Figure 11A:
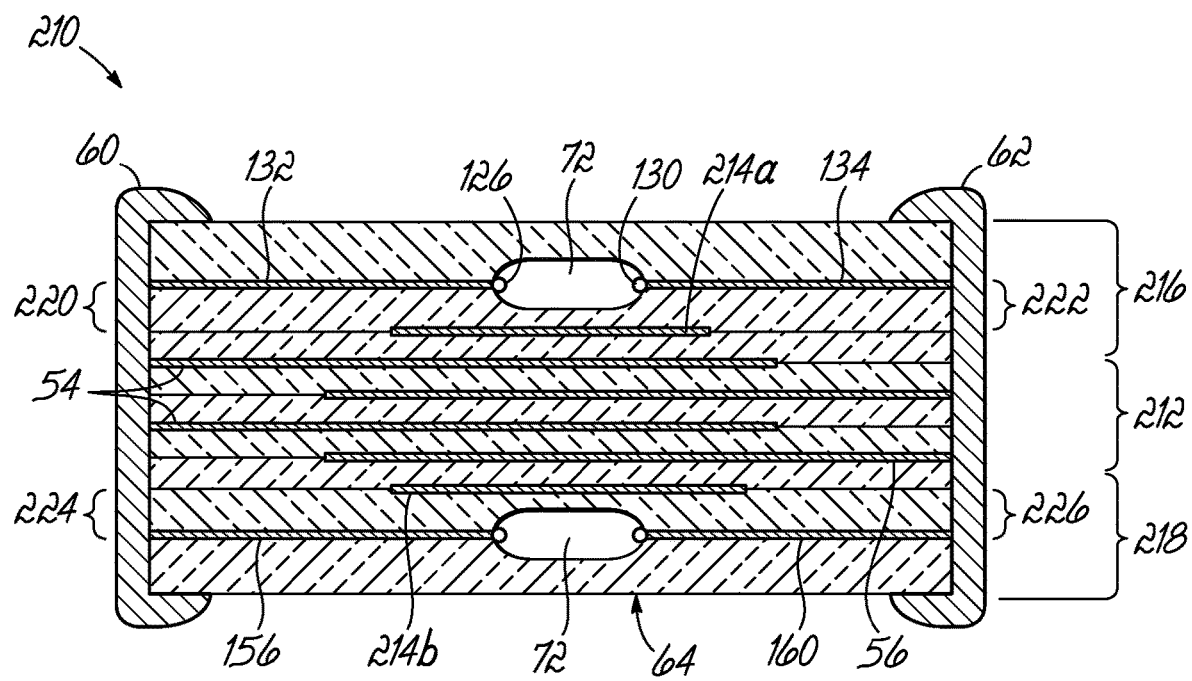
FIG. 11A illustrates a ninth embodiment of an integrated multilayer capacitor in accordance with further aspects of the present invention.
Figure 11B:
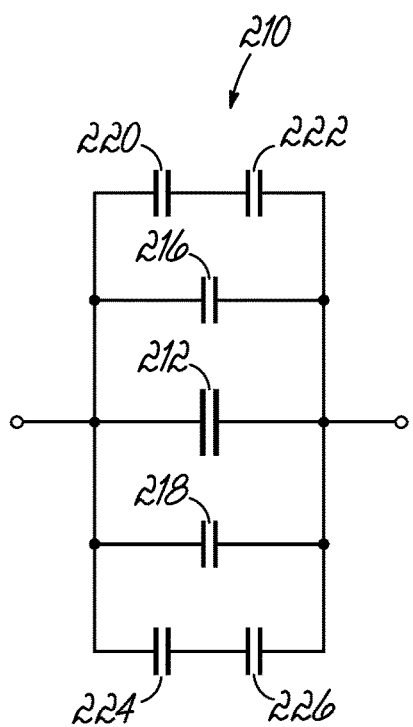
FIG. 11B illustrates an equivalent circuit diagram.

FIGS. 11A and 11B illustrate yet another alternative embodiment for a multilayer capacitor in which the capacitor 210 includes a low frequency, higher value bulk capacitor section 212. Capacitor section 212 includes a first plurality of conductive layers 54 connected to an external contact 60 and a second plurality of opposed, parallel conductive layers 56 connected to an external contact 62. The capacitor 210 further has a pair of higher frequency, lower value capacitances formed in internal voids 72 between exposed ends of upper and lower conductive layers, which are separated to form oppositely-charged plate pairs 132, 134 and 156, 160. The voids 72 are located wholly within the dielectric body 64 and bounded by upper and lower dielectric layers. As in the previous embodiments, the spacing between the exposed plate edges prevents a short circuit from existing between conductive contacts 60, 62. The oppositely charged exposed edges of the plates 132, 134 and 156, 160 create higher frequency, fringe effect capacitances within the voids 72 of sections 216, 218. In addition to the air gap capacitances, each of the high frequency capacitor sections 216, 218 includes a conductive floating plate 214a, 214b that is not connected to either of the metallized external contacts 60, 62. The conductive floating plates 214a, 214b create additional capacities within the body of the device 210. FIG. 11B illustrates an equivalent circuit diagram of operative capacitances in the device of FIG. 11A. As shown in FIG. 11B, the first floating conductive plate 214a forms a capacitor 220 with conductive plate 132, and a capacitor 222 with conductive plate 134. The second floating conductive plate 214b forms a capacitor 224 with conductive plate 156 and a capacitor 226 with conductive plate 160. FIG. 11A depicts the internal voids 72 formed by drilling, however the voids may also be formed by other fabrication processes, including processes that would form one or more nubs at the exposed ends of the conductive layers.

Figure 12A:
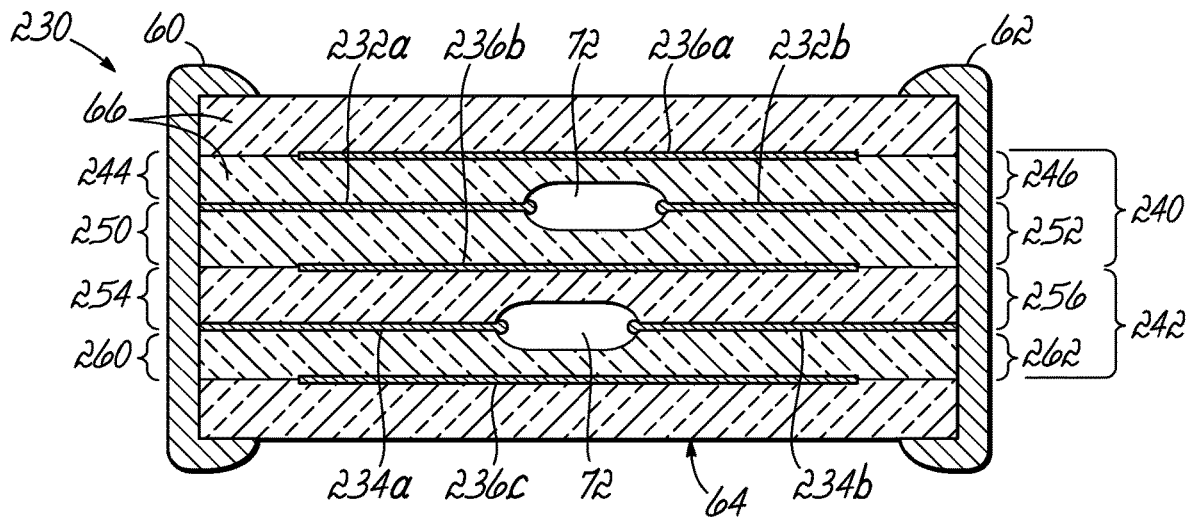
FIG. 12A illustrates a tenth embodiment of an integrated multilayer capacitor illustrating an alternative arrangement of conductive and dielectric layers.
Figure 12B:
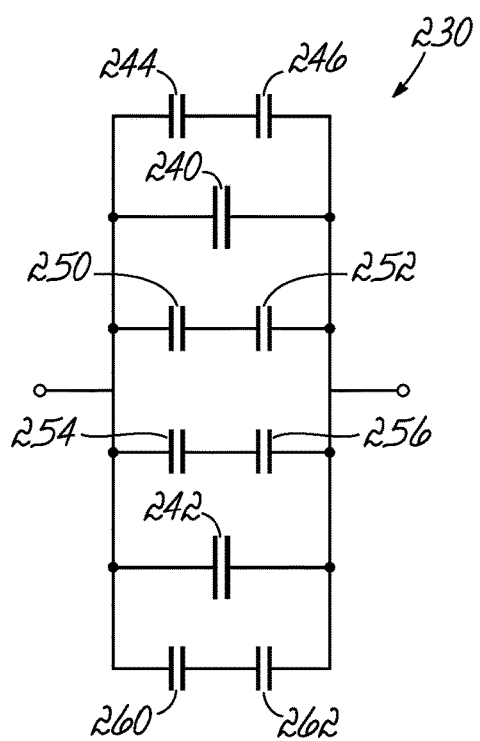
FIG. 12B illustrates an equivalent circuit diagram.

FIGS. 12A and 12B illustrate yet another alternative embodiment for an integrated, multilayer capacitor. In this embodiment, the capacitor 230 has a pair of high frequency, low value capacitances formed in internal voids 72 between exposed ends of upper and lower conductive layers, which are separated to form oppositely-charged plate pairs 232a, 232b and 234a, 234b. The voids 72 are located wholly within the dielectric body 64 and bounded by upper and lower dielectric layers. As in the previous embodiments, the spacing between the exposed plate edges prevents a short circuit from existing between external contacts 60, 62. The oppositely charged exposed edges of the plates 232a, 232b and 234a, 234b create higher frequency, fringe effect capacitances 240, 242 within the voids 72. In this embodiment, conductive floating plates 236a, 236b, and 236c are spaced between dielectric layers 66 above and below each of the internal voids 72 to form additional capacitances. The floating plates 236a, 236b, and 236c are not connected to either of the metallized external contacts 60, 62. FIG. 12B illustrates an equivalent circuit diagram of operative capacitances in the device of FIG. 12A. As shown in FIG. 12B, the first floating conductive plate 236a forms a capacitor 244 with conductive plate 232a, and a capacitor 246 with conductive plate 232b. The second floating conductive plate 236b forms a capacitor 250 with conductive plate 232a, a capacitor 252 with conductive plate 232b, a capacitor 254 with conductive plate 234a, and a capacitor 256 with conductive plate 234b. The third floating conductive plate 236c forms a capacitor 260 with conductive plate 234a, and a capacitor 262 with conductive plate 234b. FIG. 12A depicts the internal voids 72 formed by drilling, however the voids may also be formed by other fabrication processes, including processes that would form one or more nubs at the exposed ends of the conductive layers.

Figure 13A:
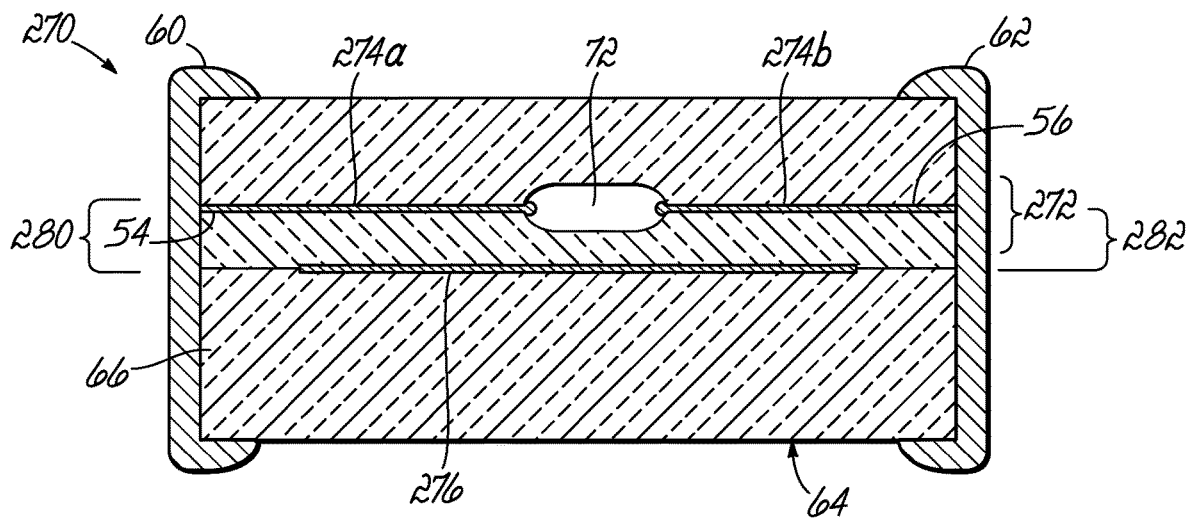
FIG. 13A illustrates an eleventh embodiment of an integrated multilayer capacitor.
Figure 13B:
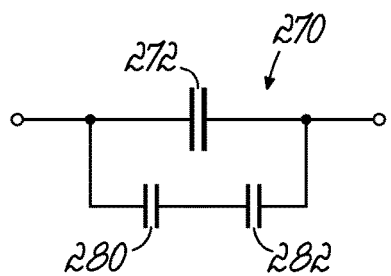
FIG. 13B illustrates an equivalent circuit diagram.

FIGS. 13A and 13B illustrate yet another embodiment for an integrated, multilayer capacitor. In this embodiment, the capacitor 270 includes a high frequency, low value capacitance 272 formed in an internal void 72 between exposed ends of a conductive layer separated to form oppositely-charged plates 274a, 274b. The capacitor 270 also includes a single floating conductive plate 276 spaced from the void 72 by a dielectric layer. The floating conductive plate 276 forms additional series capacitors. The first capacitor 280 being formed between the floating plate 276 and conductive plate 274a, and the second capacitor 282 being formed between the floating plate and conductive plate 274b. FIG. 13A depicts the internal void 72 formed by drilling, however the void may also be formed by other fabrication processes, including processes that would form one or more nubs at the exposed ends of the conductive layers.

Figure 13C:
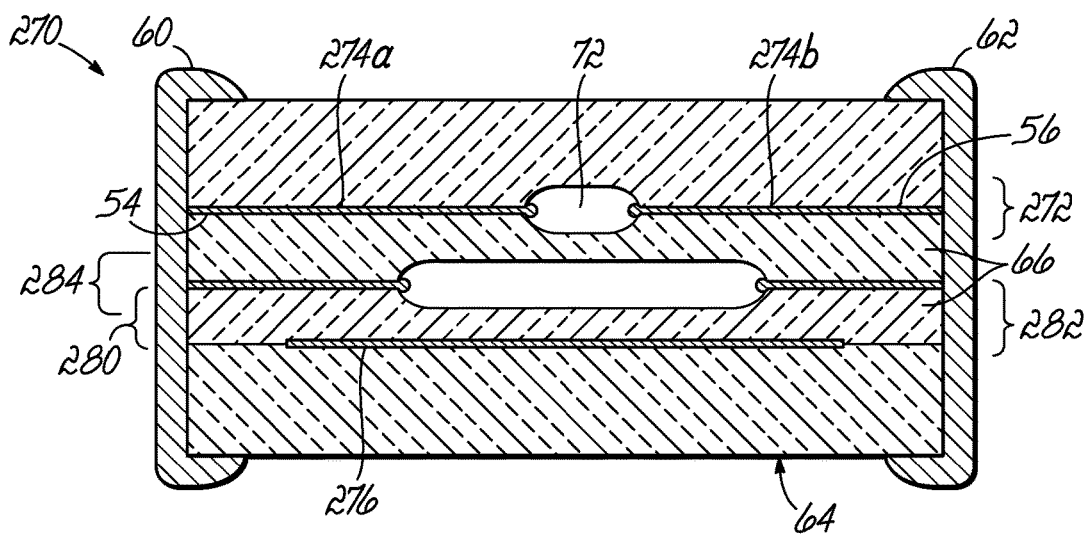
FIG. 13C illustrates an alternative embodiment for the integrated multilayer capacitor of FIG. 13A, with a pair of internal void high frequency capacitances formed between exposed edges of conductive plates, in which the pair of internal void high frequency capacitances differ in magnitude.
Figure 13D:
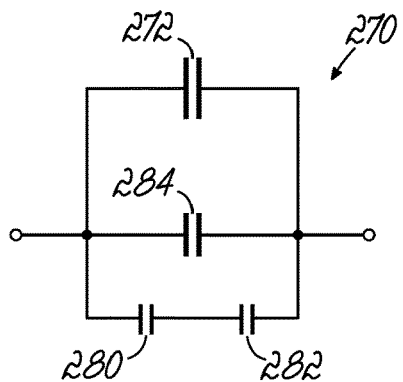
FIG. 13D illustrates an equivalent circuit diagram.
Figure 13E:
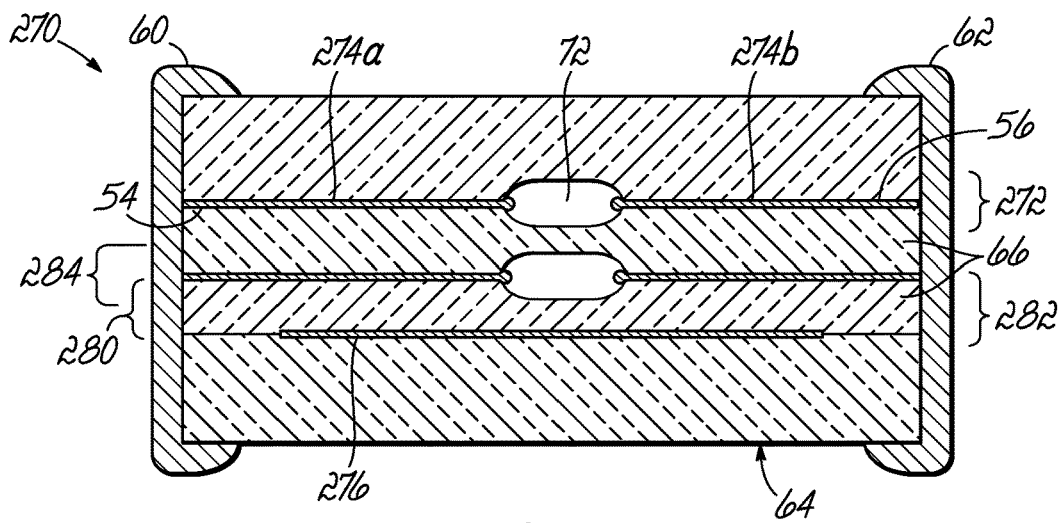
FIG. 13E illustrates the integrated multilayer capacitor of FIG. 13C, in which the pair of internal void high frequency capacitances are of equal magnitude.
Figure 13F:
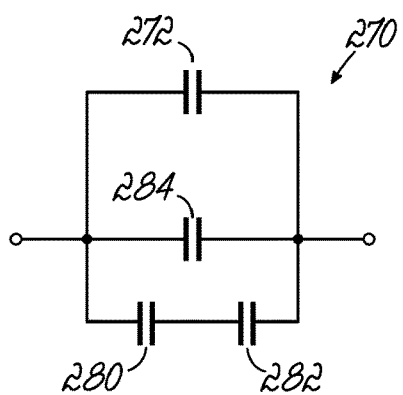
FIG. 13F illustrates an equivalent circuit diagram.

FIG. 13C illustrates an alternative embodiment of the integrated multilayer capacitor of FIG. 13A. In this alternative embodiment an additional void is present, and the longitudinal lengths of the voids differ. The void 72' depicted in this embodiment has a longitudinal length that is of a larger magnitude than that of the void 72, though alternative arrangements (e.g., a longitudinal length that is of a smaller magnitude) may be used as well. By varying the longitudinal length of the voids 72, 72', the overlap between the conductive layers 54, 56 also differs. Accordingly, the capacitances 272, 284 created within the voids 72, 72' also differ. This is exemplified by capacitor 284 having a lower value and higher frequency than capacitor 272. FIG. 13D illustrates an equivalent circuit diagram of operative capacitances in the device of FIG. 13C. FIG. 13E illustrates an alternative embodiment of the integrated multilayer capacitor of FIG. 13A, where an additional void is present and the voids 72 share the same magnitude. FIG. 13F illustrates an equivalent circuit diagram of operative capacitances in the device of FIG. 13E.

Figure 14A:
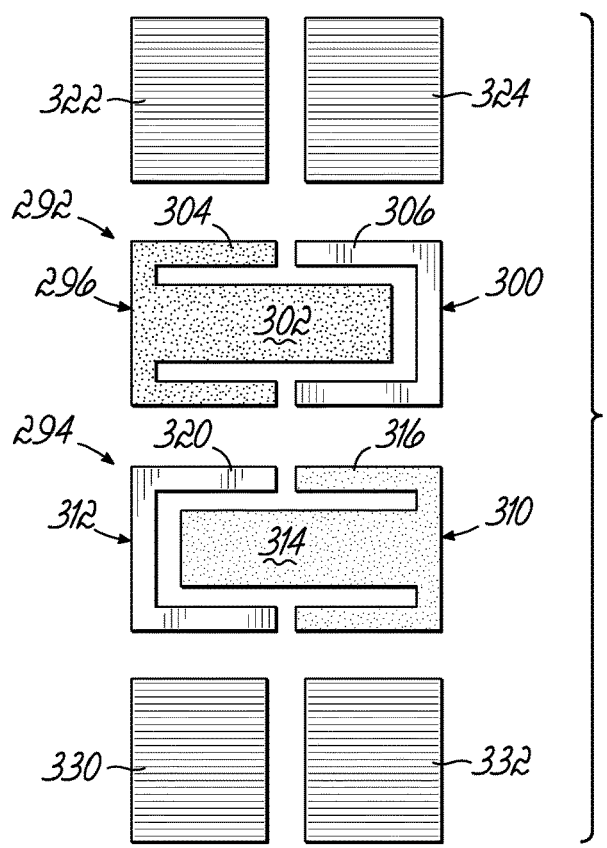
FIG. 14A is a planar view of two representative conductive layers and a pair of conductive plates for another integrated multilayer capacitor embodiment.

FIGS. 14A through 14H depict another embodiment for an integrated, multilayer capacitor. In this embodiment, the capacitor 290 includes alternating first and second conductive layers. FIG. 14A depicts a representative first conductive layer 292 and a representative second conductive layer 294. Each first conductive layer 292 includes a first main electrode 296 and a separate, first counter electrode 300 in substantially the same plane. The main electrode 296 includes a central portion 302 and at least one extension arm 304 positioned beside the central portion. The counter electrode 300 includes at least one extension arm 306 substantially longitudinally aligned with the at least one extension arm 304 of the first main electrode. Each second conductive layer 294 includes a second main electrode 310 and a second, separate counter electrode 312 provided in substantially the same plane. The second main electrode 310 includes a central portion 314 and at least one extension arm 316 positioned beside the central portion. The second counter electrode 312 includes at least one extension arm 320 substantially longitudinally aligned with the at least one extension arm of the second main electrode.

Figure 14B:
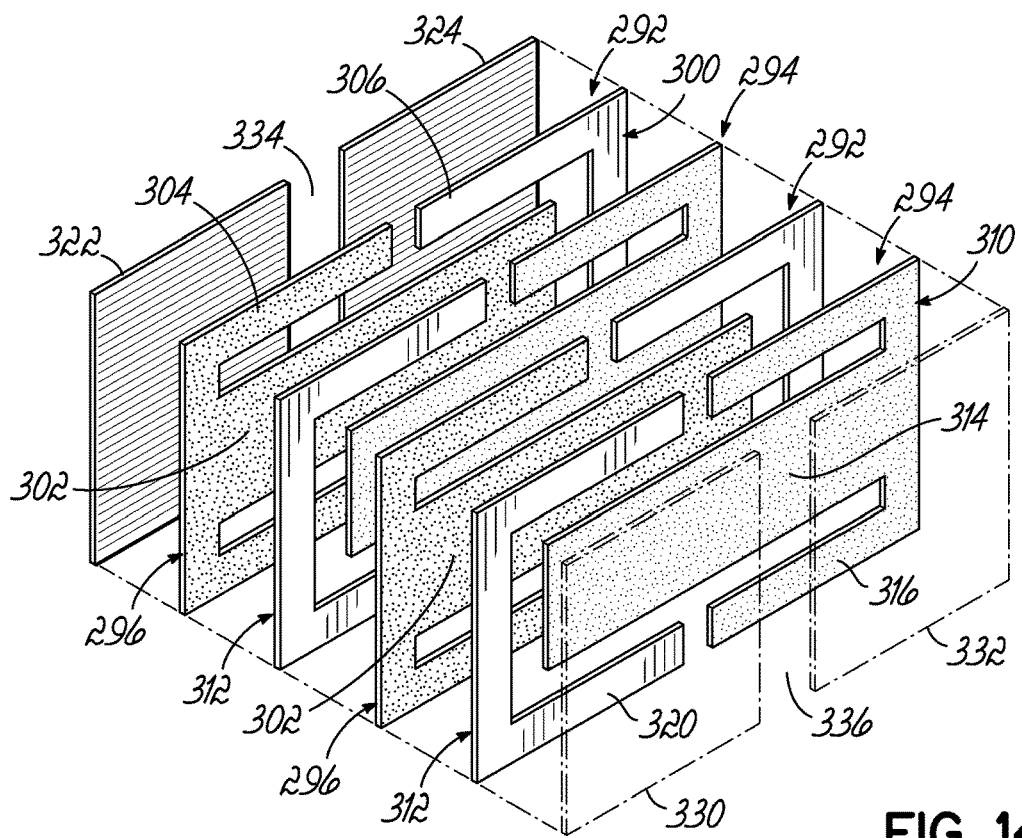
FIG. 14B is a perspective view of a stack of four conductive layers and two pairs of conductive plates according to the embodiment of FIG. 14A.

In capacitor 290, dielectric material is interleaved between adjacently stacked first and second conductive layers 292, 294, and the layers are stacked such that at least part of the central portion 302 of each first main electrode 296 overlaps with at least part of the central portion 314 of the second main electrode 310. One of the external contacts 60 is electrically connected to each first main electrode 296 and second counter electrode 312, and the second external contact 62 is electrically connected to each second main electrode 310 and first counter electrode 300. In addition to the stacked, interleaved conductive layers, capacitor 290 includes a first set of conductive plates 322, 324 on the top of the stack, and a second set of conductive plates 330, 332 on the bottom of the stack. The top and bottom sets of conductive plates are spaced apart to form gaps 334, 336 between each plate pair. The top and bottom conductive plate pairs 322, 324, and 330, 332 provide additional capacitance within the pair, and between immediately adjacent sections of the conductive layers 292, 294. FIG. 14B illustrates an exemplary stacking of the conductive layers 292, 294. For ease of illustration in the perspective of FIG. 14B the bottom conductive plates 330, 332 are illustrated transparently with an outline only. The capacitor 290 with the described arrangement of stacked conductive layers and plates can be mounted in multiple orientations on any of a plurality of different board surfaces. Additional details regarding the alternating main electrode and counter electrode structure in the stacked interleaved conductive layers 292, 294 can be found in U.S. Pat. No. 8,446,705 to Ritter et al., which is incorporated herein by reference.

In the present embodiment, at least one internal void 72 is formed in at least one of the first and second conductive layers 292, 294 between the end of the at least one main electrode extension arm 304 or 316 and the corresponding counter electrode extension arm 306 or 320. In the representative embodiment shown in FIGS. 14C-14E, a pair of internal voids 72 are formed in each of the conductive layers 292, 294, one between each of the main electrode extension arms 304, 316 and counter electrode extension arms 306, 320. Each of the at least one internal voids 72 is at least partially enclosed within the ceramic body and bounded by at least a portion of a dielectric layer. The spacing between the extension arms on the boundaries of the voids 72 is such as to prevent conduction between the main and counter electrodes, while allowing a nonconductive connection between the oppositely charged ends of the extension arms.

In addition to voids between the extension arms, a portion of the dielectric material is removed in the gaps 334, 336 between the top and bottom conductive plate pairs 322, 324 and 330, 332. The removal of the dielectric between the sets of conductive plates forms voids 72 between the plates. The internal voids between the conductive plates are bordered by outer dielectric layers 340, 342 (shown in FIG. 14C) so as to be at least partially enclosed within the body of the capacitor. The oppositely charged conductive plates 322, 324 and 330, 332 produce a fringe effect capacitance within the voids 72.

Figure 14C:
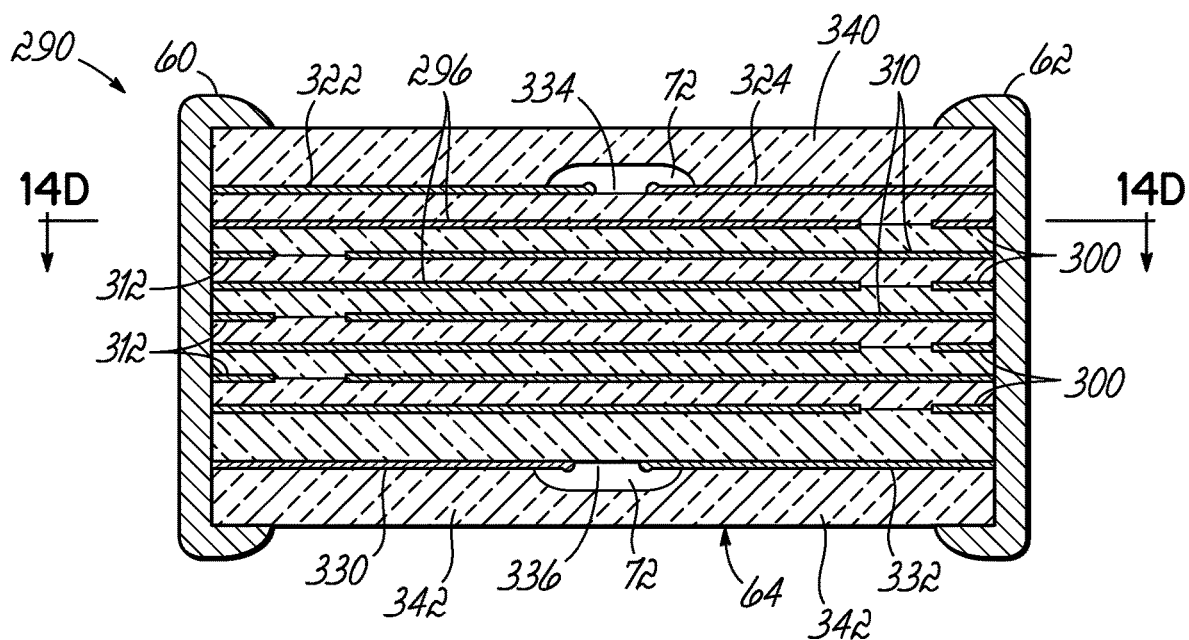
FIG. 14C is a side view of an integrated multilayer capacitor according to the embodiment of FIG. 14A.
Figure 14D:
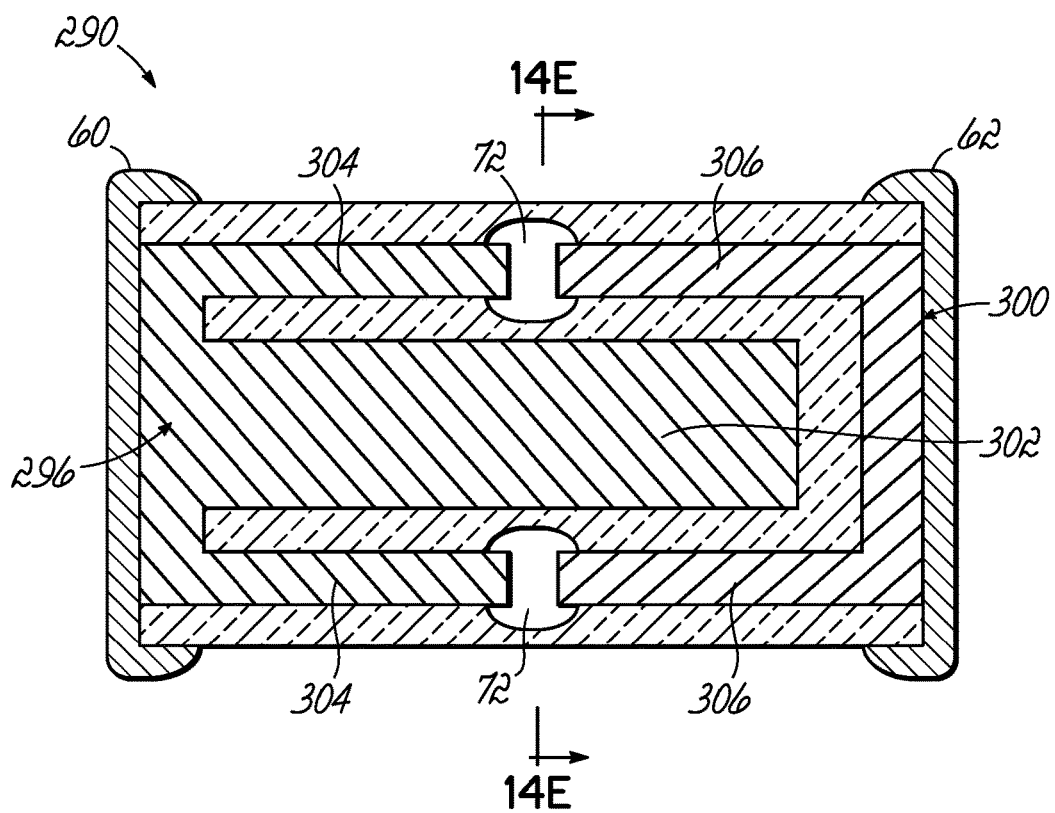
FIG. 14D is a top view of the capacitor illustrated in FIG. 14C.
Figure 14E:
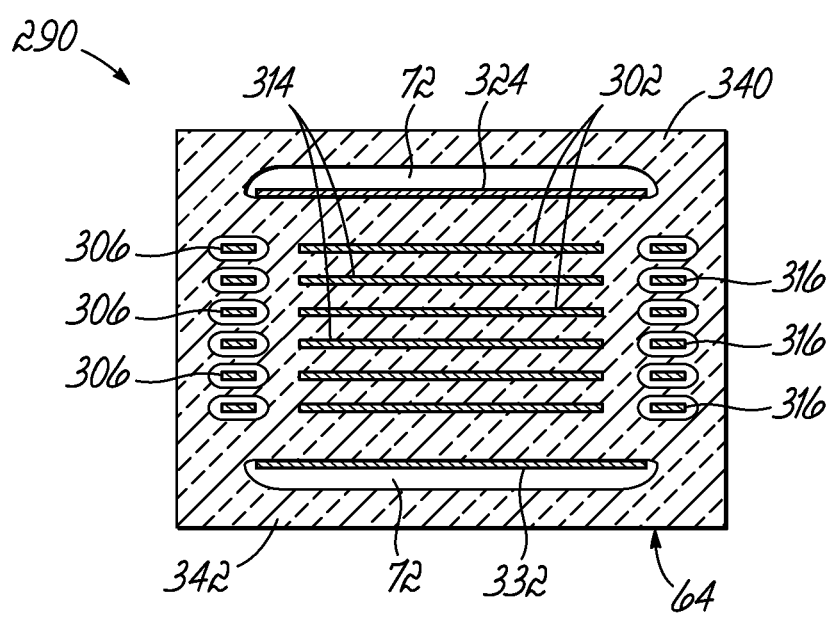
FIG. 14E is a sectional view of the capacitor of FIG. 14D, taken along line 14E-14E of FIG. 14D.
Figure 14F:
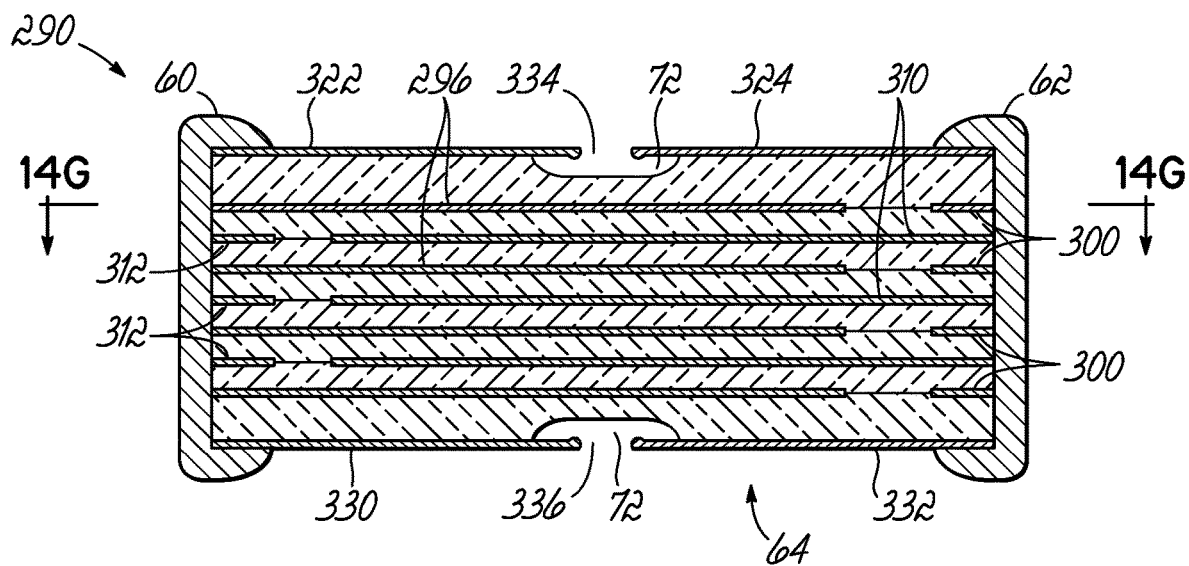
FIG. 14F illustrates a side view of an integrated multilayer capacitor according to an alternative embodiment of FIG. 14A, in which outer dielectric layers are removed and voids are formed on remaining dielectric layers.
Figure 14G:
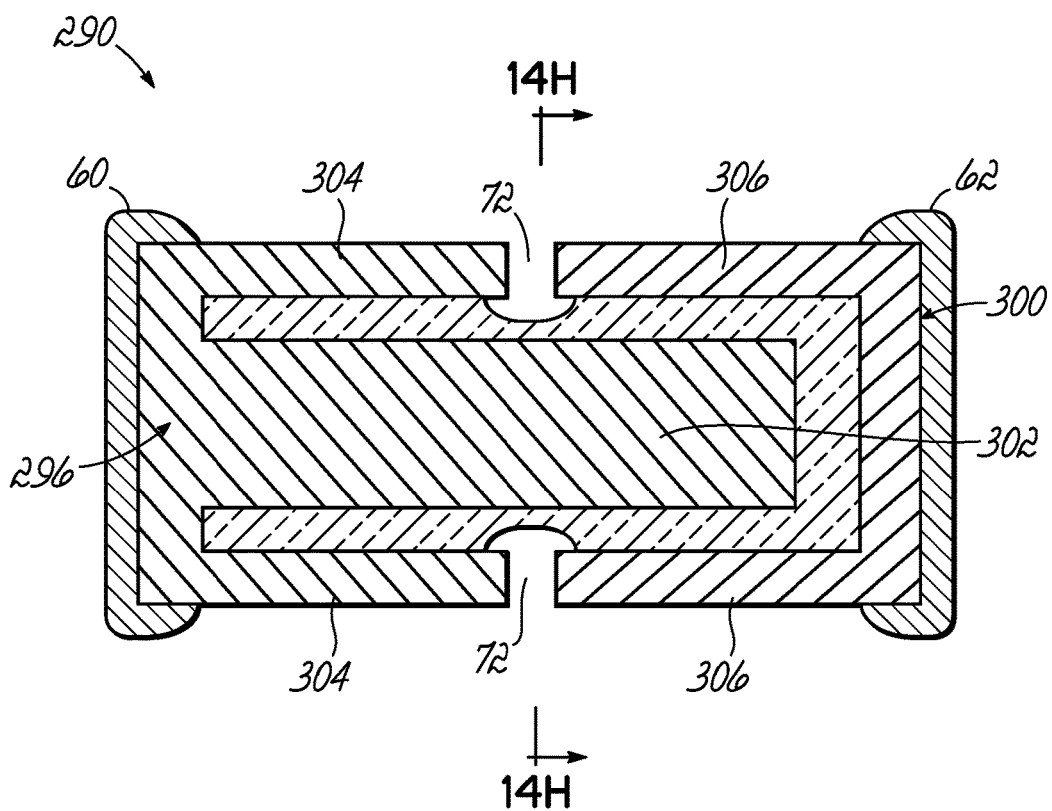
FIG. 14G is a top view of the capacitor illustrated in FIG. 14F.
Figure 14H:
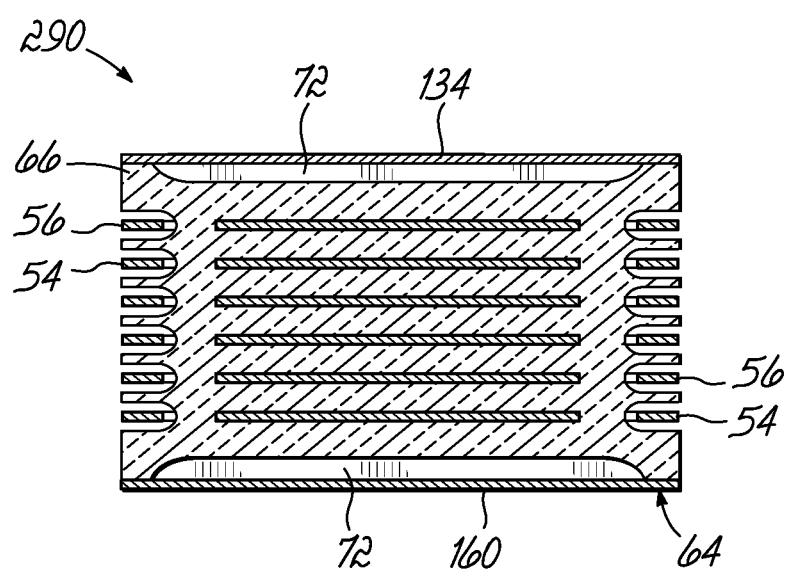
FIG. 14H is a sectional view of the capacitor of FIG. 14F, taken along line 14H-14H of FIG. 14G.

As shown in FIGS. 14F-14H, additional embodiments may forgo the inclusion of the outer dielectric layers 340, 342 of FIGS. 14C-14E. In this embodiment, internal voids 72 are partially enclosed within the ceramic body and partially bounded by at least a portion of a dielectric layer. A portion of the inner dielectric layers 66 is removed in the gaps 334, 336 between the top and bottom conductive plate pairs 322, 324 and 330, 332. The removal of the dielectric between the sets of conductive plates forms voids 72 between the plates. The oppositely charged conductive plates 322, 324 and 330, 332 produce a fringe effect capacitance within the voids 72.

Figure 16A:
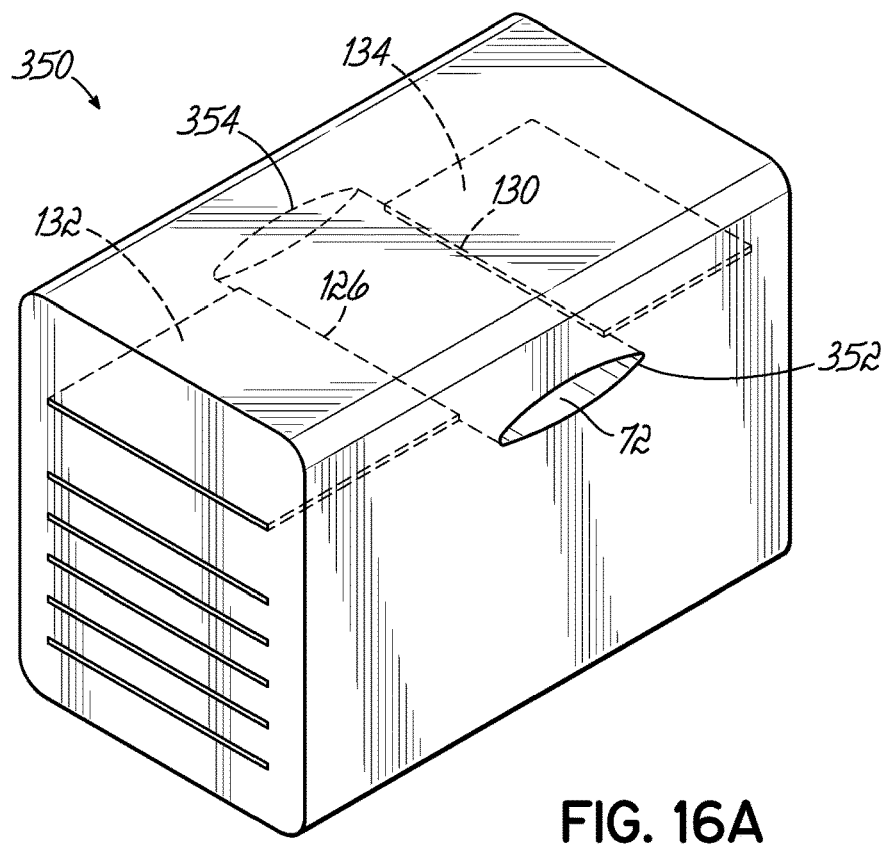
FIG. 16A illustrates a perspective view of a twelfth embodiment of an integrated multilayer capacitor in which the void is an air gap across a single conductive plate that is of parallel orientation to the single conductive plate.
Figure 16B:
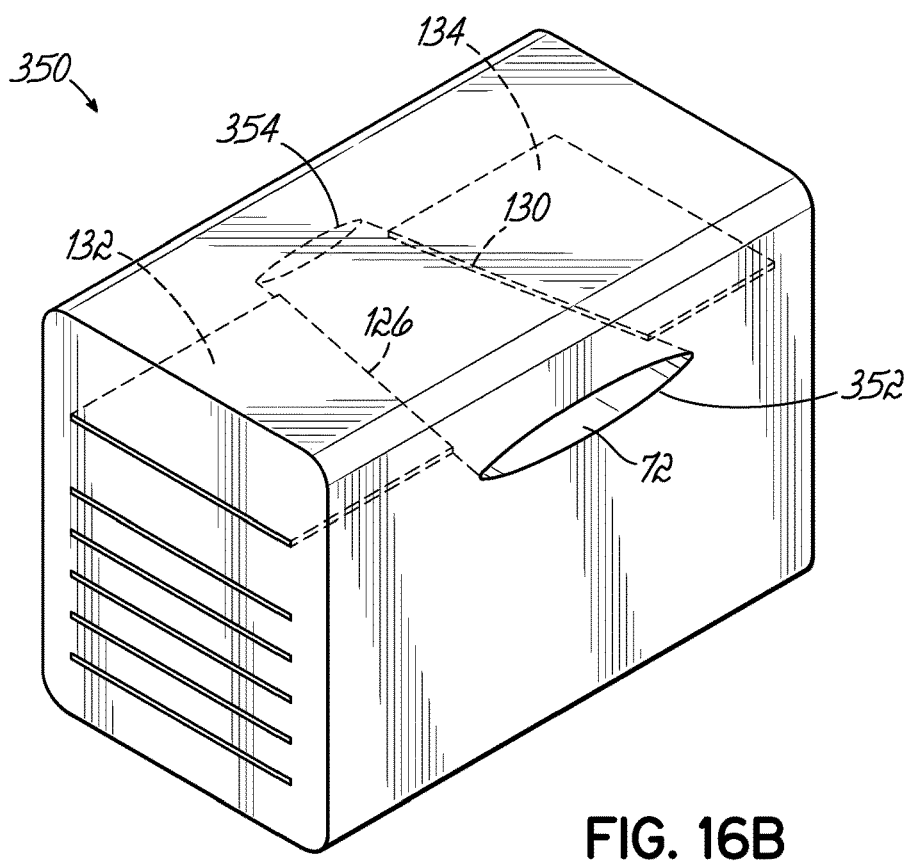
FIG. 16B illustrates an alternative embodiment for the integrated multilayer capacitor of FIG. 16A, in which the void is an alternative shape.

In alternative embodiments of the invention, the void 72 may be only partially enclosed within an integrated, multi-layer broadband capacitor. FIG. 16A illustrates a twelfth embodiment, where the capacitor 350 includes a void 72 that is open to the external environment of the capacitor 350 in multiple areas. In this embodiment, the void 72 separates the conductive layer 122 into a first coplanar plate 132 and a second coplanar plate 134, with spaced apart, oppositely charged edges 126, 130. The void 72 is open to the external environment of the capacitor 350 through multiple openings. In the embodiment shown in FIG. 16A, the void 72 includes a first end 352 and a second end 354, both of which are exposed to the external environment of the capacitor 350. The void 72 forms an air gap that prevents conduction between the coplanar plates 132, 134, but allows for a fringe effect capacitance between the oppositely charged edges 126, 130. Additionally, FIG. 16A depicts the void 72 in a cylindrical shape, however alternative embodiments may utilize a different shape for the void 72. FIG. 16B illustrates a conical shape to the void 72.

Figure 17A:
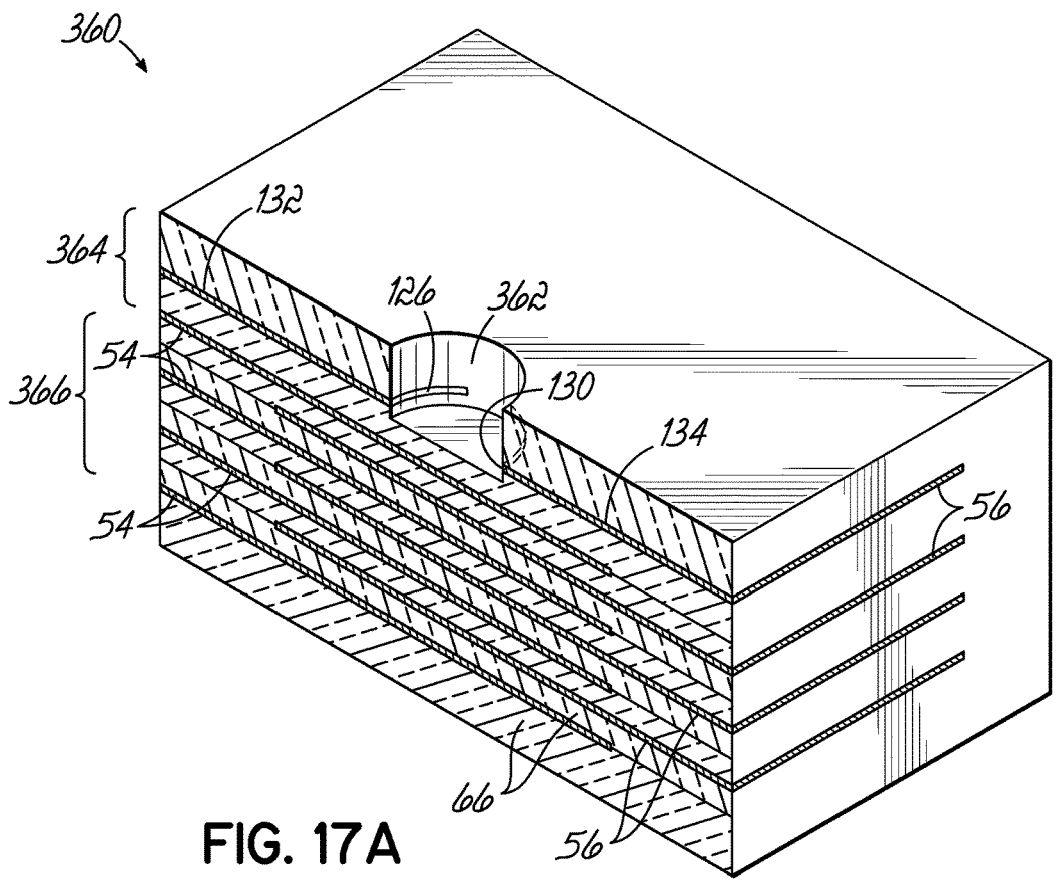
FIG. 17A is a partially sectioned perspective view of a thirteenth embodiment of an integrated multilayer capacitor which illustrates an air gap across a single conductive plate that is of perpendicular orientation to the single conductive plate.
Figure 17B:
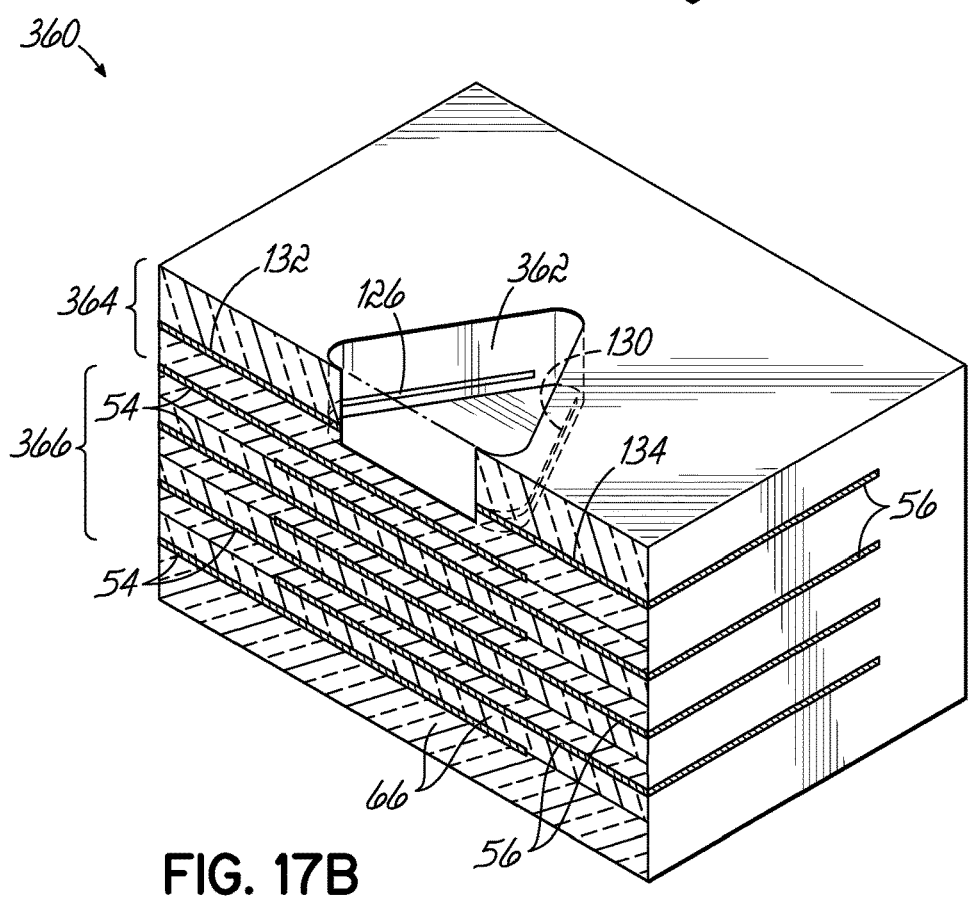
FIG. 17B illustrates an alternative embodiment for the integrated multilayer capacitor of FIG. 17A, in which the air gap is in a triangular shape.
Figure 17C:
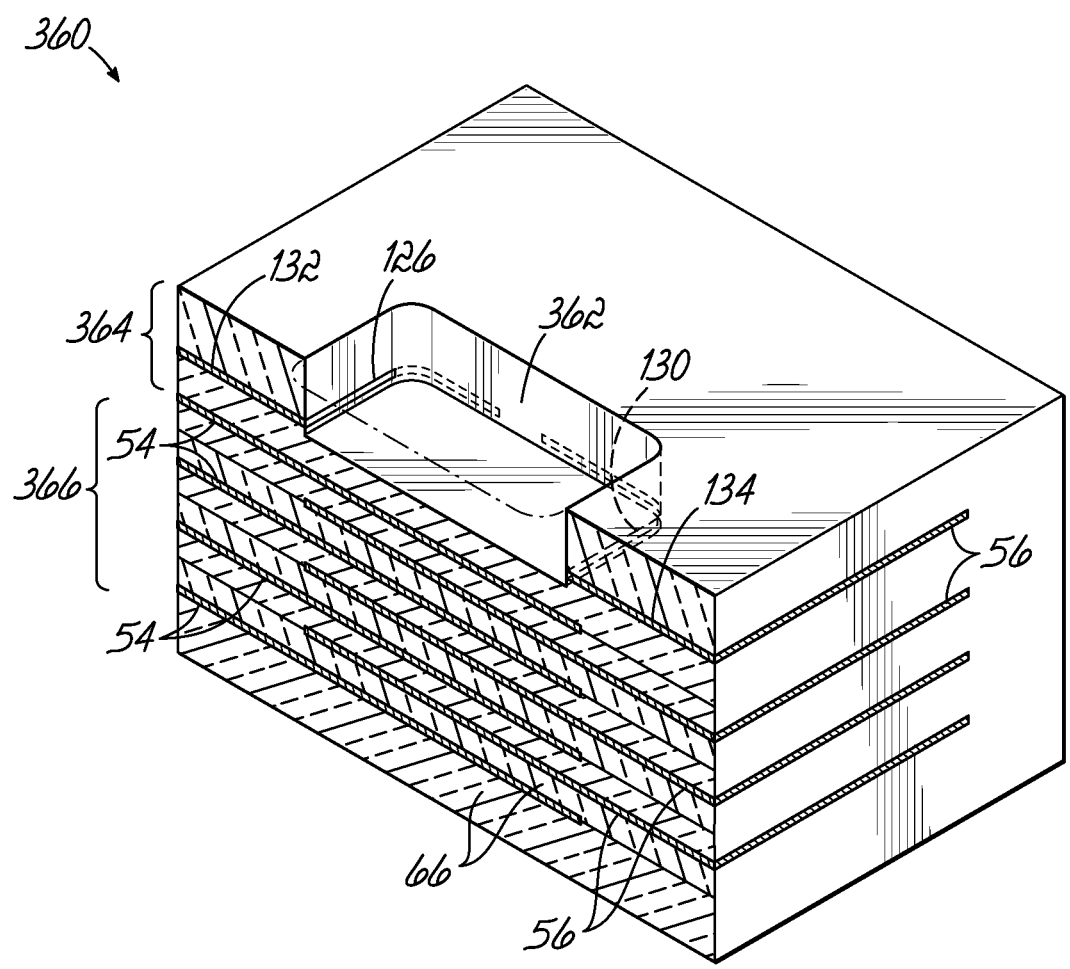
FIG. 17C illustrates an alternative embodiment for the integrated multilayer capacitor of FIG. 17A, in which the air gap is in a rectangular shape.

FIG. 17A illustrates a thirteenth embodiment of the invention, where the capacitor 360 includes a void 72 that is open to the external environment of the capacitor 360 in a single area. In this embodiment, the void 72 separates the conductive layer 122 into a first coplanar plate 132 and a second coplanar plate 134, with spaced apart, oppositely charged edges 126, 130. The void 72 is open to the external environment of the capacitor 360 through a single opening. In the embodiment shown in FIG. 17A, the void 72 includes a first end 362 and a second end 364. The first end 362 is exposed to the external environment of the capacitor 360 while the second end 364 is bordered by the surrounding dielectric layer 66. The void 72 forms an air gap that prevents conduction between the coplanar plates 132, 134, but allows for a fringe effect capacitance between the oppositely charged edges 126, 130. FIG. 17A also depicts the void 72 in a cylindrical shape, however alternative embodiments may utilize a different shape for the void 72. FIGS. 17B and 17C illustrate a triangular shape and rectangular shape, respectively, for the void 72.

Figure 18A:
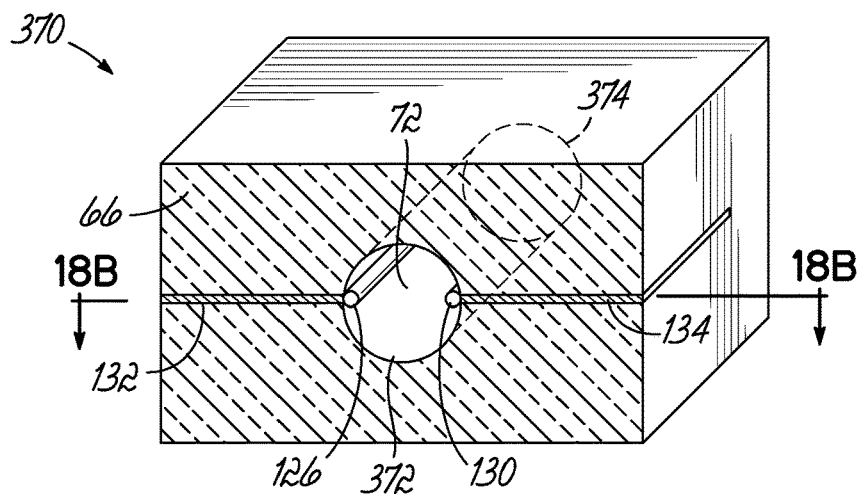
FIG. 18A is a partially sectioned perspective of a capacitor which illustrates an air gap bisecting a single conductive plate that is of parallel orientation to the single conductive plate, in which the air gap is in a cylindrical shape.
Figure 18B:
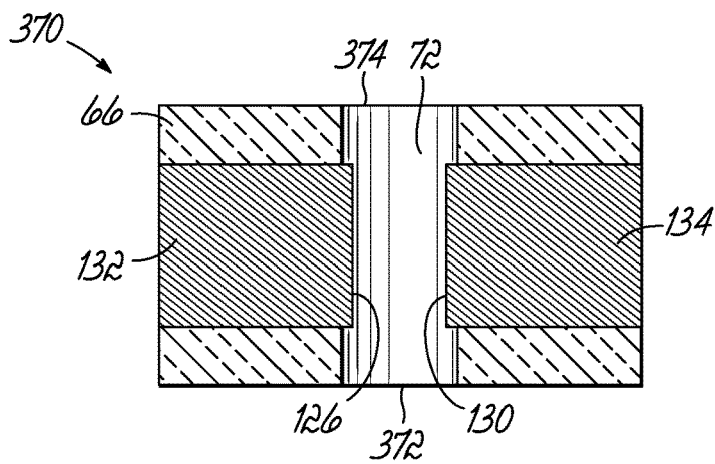
FIG. 18B is a sectional view of the capacitor of FIG. 18A, taken along line 18B-18B of FIG. 18A.
Figure 18C:
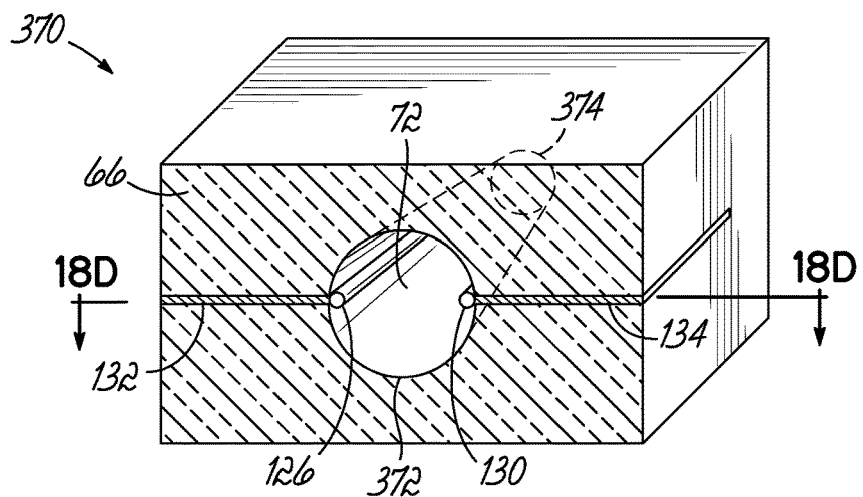
FIG. 18C is an alternative embodiment of the capacitor of FIG. 18A, in which the air gap is in a conical shape.
Figure 18D:
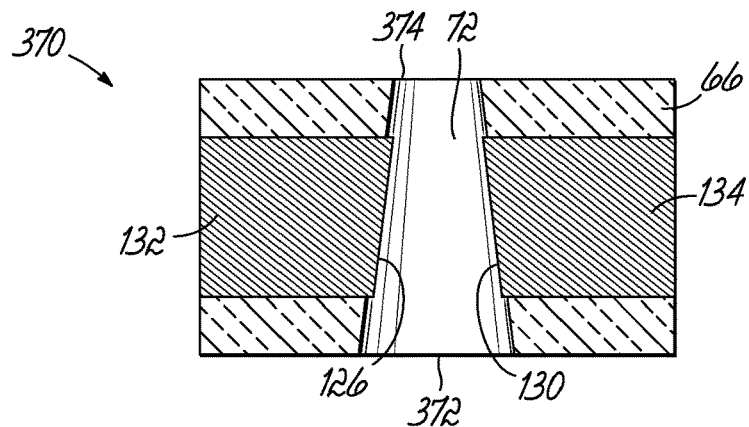
FIG. 18D is a sectional view of the capacitor of FIG. 18C, taken along line 18D-18D of FIG. 18C.

FIGS. 18A-18D illustrate an alternative embodiment of the multilayer broadband capacitor of FIG. 16A, where only a singular conductive layer is used. In this embodiment, the capacitor 370 includes a void 72 that is open to the external environment of the capacitor 370 in multiple areas. The void 72 separates the conductive layer 122 into a first coplanar plate 132 and a second coplanar plate 134, with spaced apart, oppositely charged edges 126, 130. The void 72 is open to the external environment of the capacitor 370 through multiple openings. In the embodiment shown in FIGS. 18A and 18B, the void 72 includes a first end 372 and a second end 374, both of which are exposed to the external environment of the capacitor 370. The void 72 forms an air gap that prevents conduction between the coplanar plates 132, 134, but allows for a fringe effect capacitance between the oppositely charged edges 126, 130. Additionally, FIGS. 18A and 18B depict the void 72 in a cylindrical shape, however alternative embodiments may utilize a different shape for the void 72. FIGS. 18C and 18D illustrates a conical shape to the void 72.

Figure 19A:
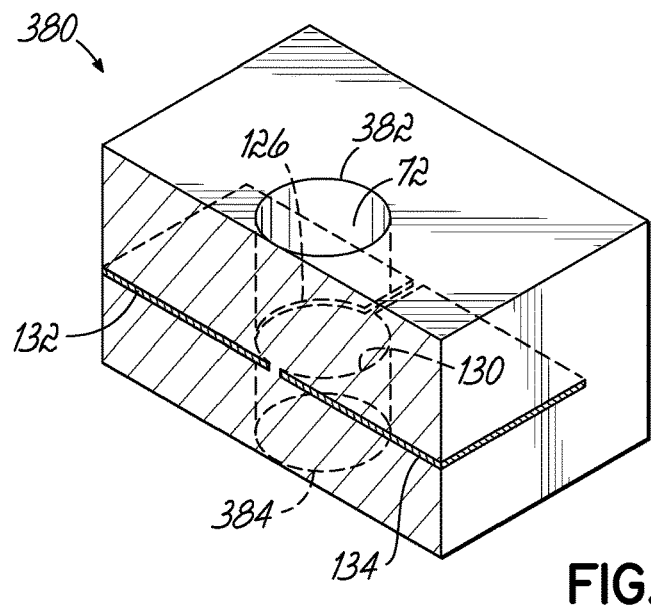
FIG. 19A is a partially sectioned perspective of a capacitor which illustrates an air gap that perforates the capacitor in an orientation that is perpendicular to a conductive plate, in which the air gap is in a cylindrical shape.
Figure 19B:
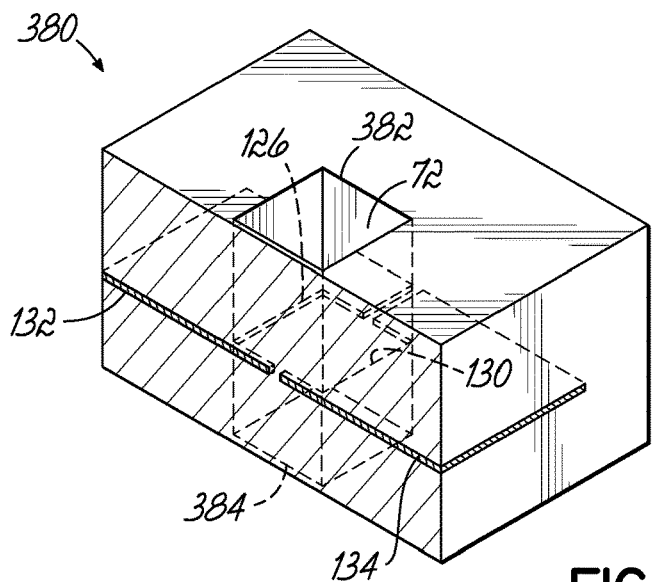
FIG. 19B is an alternative embodiment of the capacitor of FIG. 19A, in which the air gap is in a square shape.

FIGS. 19A and 19B illustrate an alternative embodiment of the multilayer broadband ceramic capacitor of FIG. 17A, where only a singular conductive layer is used. In this embodiment, the capacitor 380 includes a void 72 that is open to the external environment of the capacitor 356 in multiple areas. The void 72 at least partially separates the conductive layer 122 into a first coplanar plate 132 and a second coplanar plate 134, with spaced apart, oppositely charged edges 126, 130. The conductive layer 122 may also be partially separated by an additional gap 386, which may interface with the void 72. The void 72 is open to the external environment of the capacitor 380 through multiple openings. In the embodiment shown in FIGS. 19A and 19B, the void 72 includes a first end 382 and a second end 384, both of which are exposed to the external environment of the capacitor 380. The void 72 forms an air gap that prevents conduction between the coplanar plates 132, 134, but allows for a fringe effect capacitance between the oppositely charged edges 126, 130. FIG. 19A also depicts the void 72 in a cylindrical shape, however alternative embodiments may utilize a different shape for the void 72. FIG. 19B illustrates a rectangular shape for the void 72.

Figure 20A:
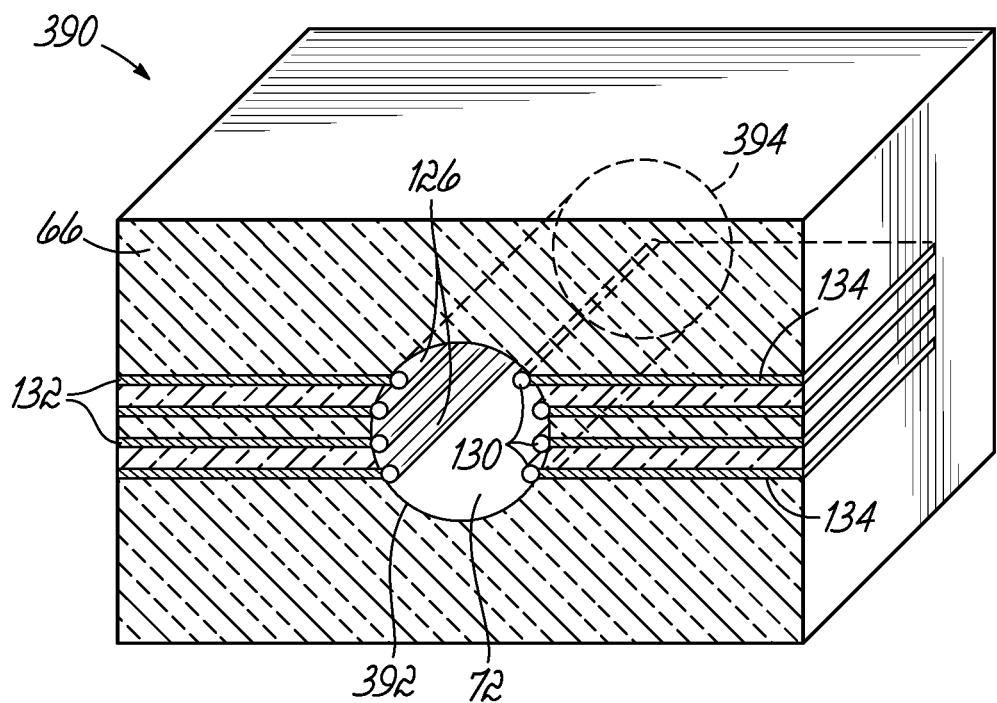
FIG. 20A is a partially sectioned perspective of an integrated multilayer capacitor which illustrates an air gap bisecting multiple conductive plates that is of parallel orientation to the multiple conductive plates, in which the air gap is in a cylindrical shape.
Figure 20B:
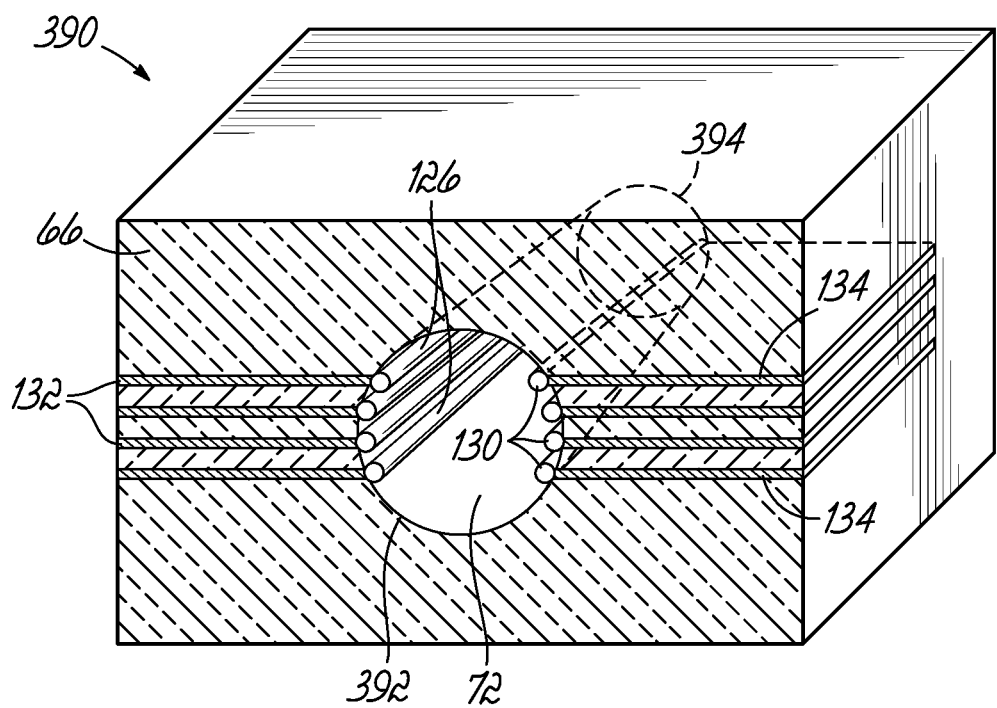
FIG. 20B is an alternative embodiment of the integrated multilayer capacitor of FIG. 20A, in which the air gap is in a conical shape.
Figure 20C:
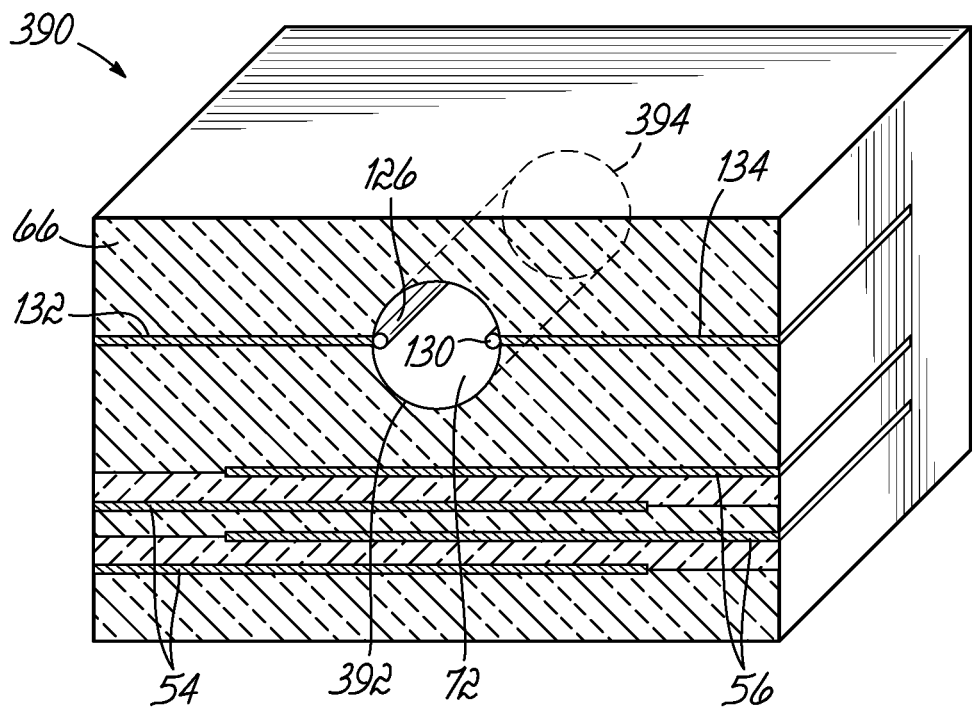
FIG. 20C is an alternative embodiment of the integrated multilayer capacitor of FIG. 20A, in which the air gap bisects a single conductive plate.
Figure 20D:
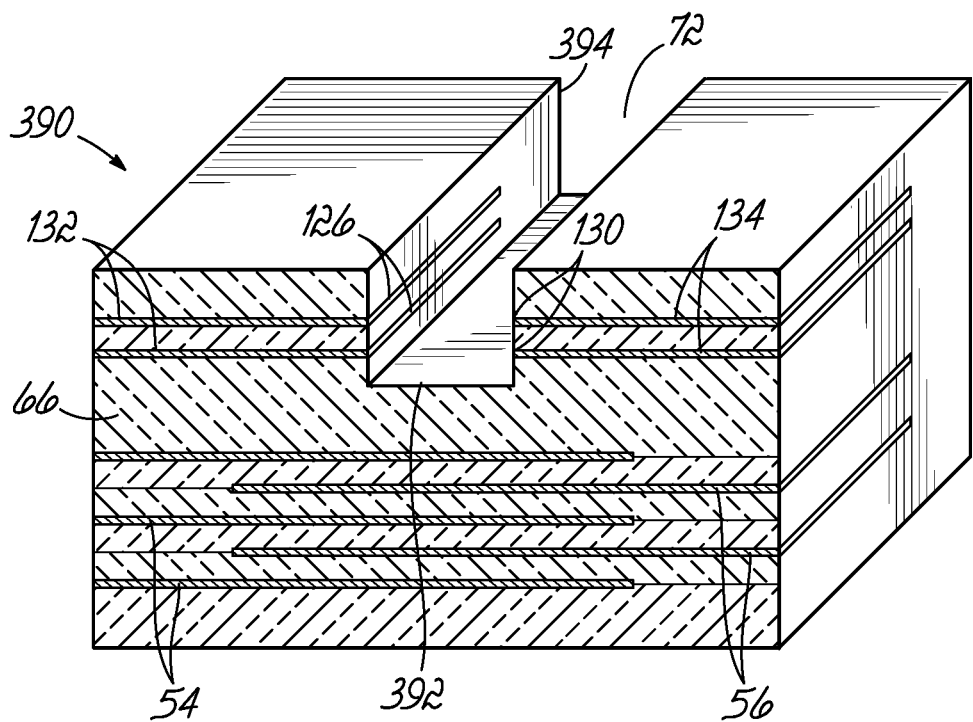
FIG. 20D is an alternative embodiment of the integrated multilayer capacitor of FIG. 20A, in which the air gap is exposed at three sides of the capacitor.

FIGS. 20A-20F illustrate alternative embodiments of the multilayer broadband capacitor of FIG. 17A. In these embodiments, the capacitor 390 includes a void 72 that is open to the external environment of the capacitor 390 in multiple areas. The void 72 separates at least one conductive layer 122 into a first coplanar plate 132 and a second coplanar plate 134, with spaced apart, oppositely charged edges 126, 130. FIG. 20C illustrates a single conductive layer 122 being separated by the void 72 while FIGS. 20A, 20B and 20D-20F depict multiple conductive layers 122 being separated by the void 72.

Figure 20E:
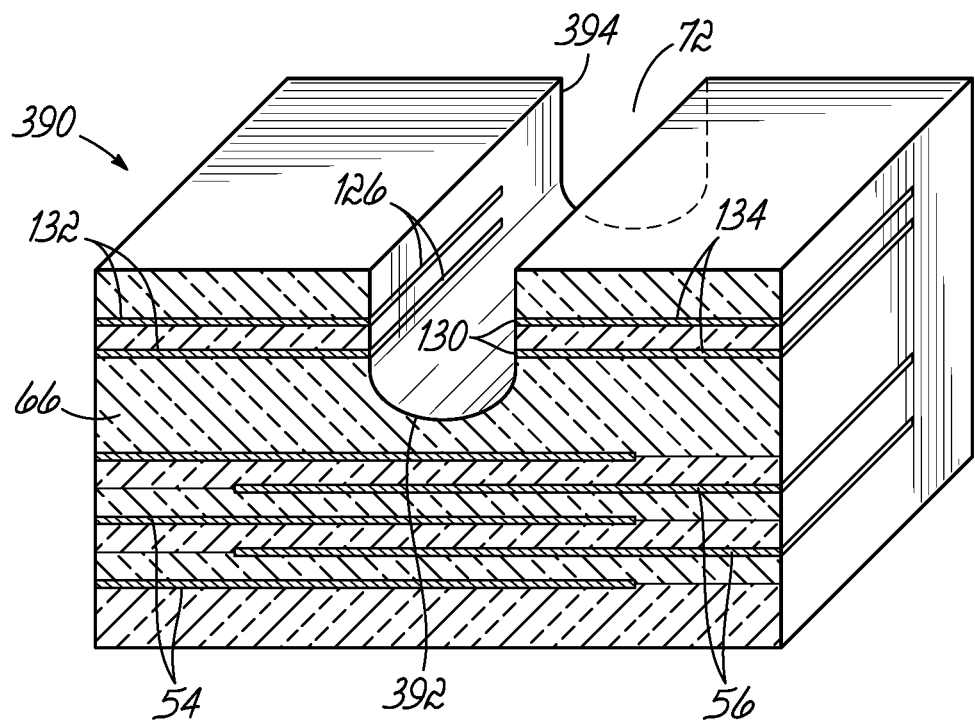
FIG. 20E is an alternative embodiment of the integrated multilayer capacitor of FIG. 20A, in which the air gap is in a partially rounded shape.
Figure 20F:
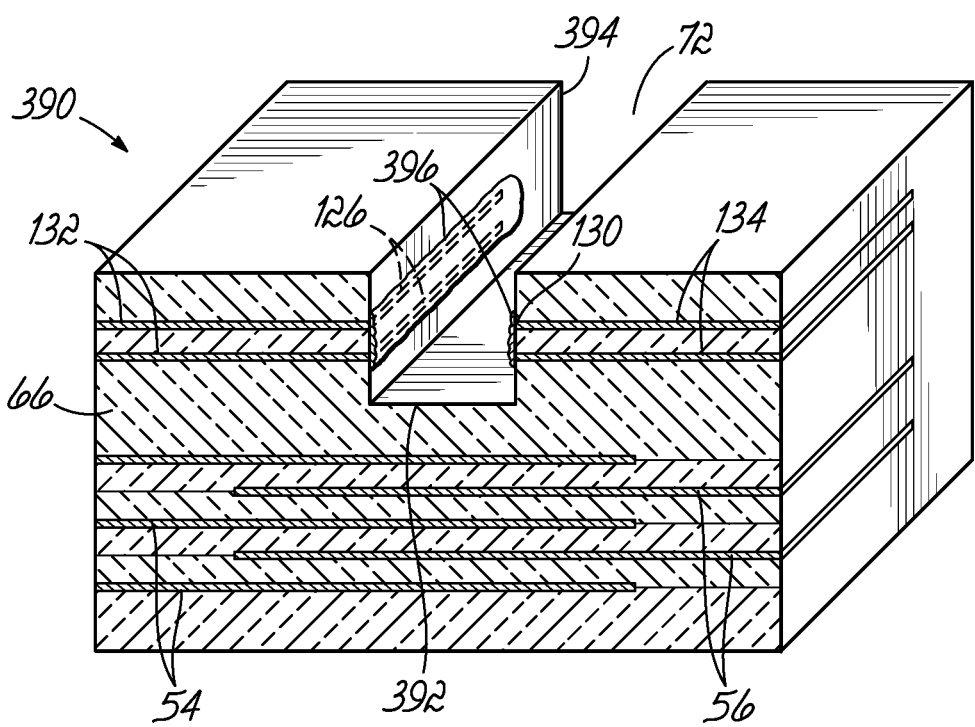
FIG. 20F is an alternative embodiment of the integrated multilayer capacitor of FIG. 20A, in which conductive plates that are exposed due to the air gap are bridged.
Figure 21A:
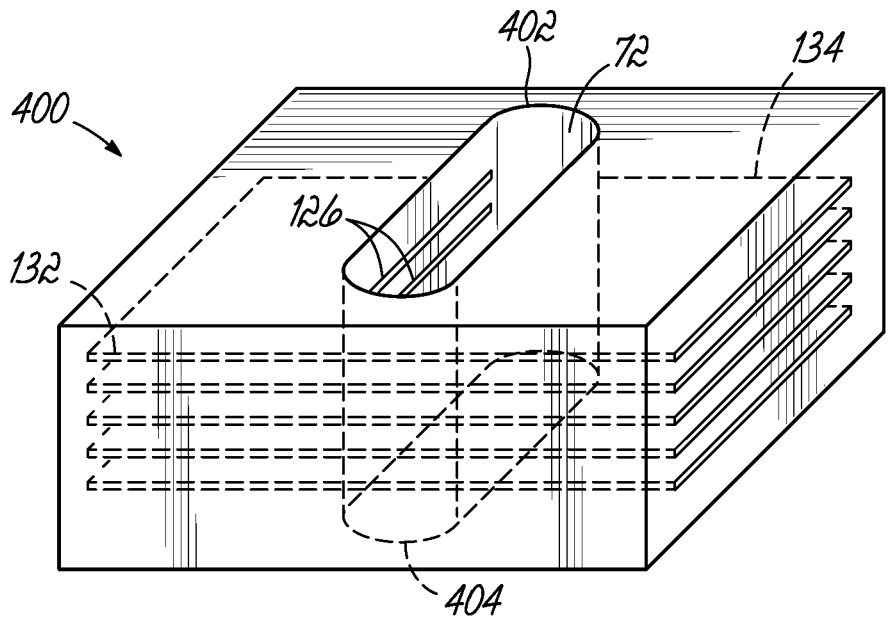
FIG. 21A is a perspective view of a capacitor which illustrates an air gap that perforates the capacitor on only one side.
Figure 21B:
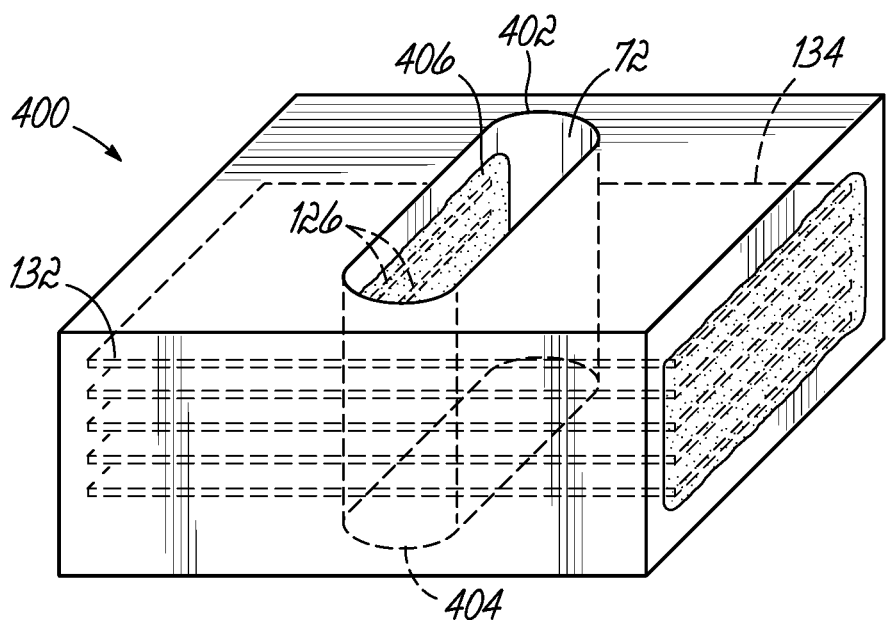
FIG. 21B is an alternative embodiment of the integrated multilayer capacitor of FIG. 21A, in which conductive plates that are exposed due to the air gap are bridged.
Figure 21C:
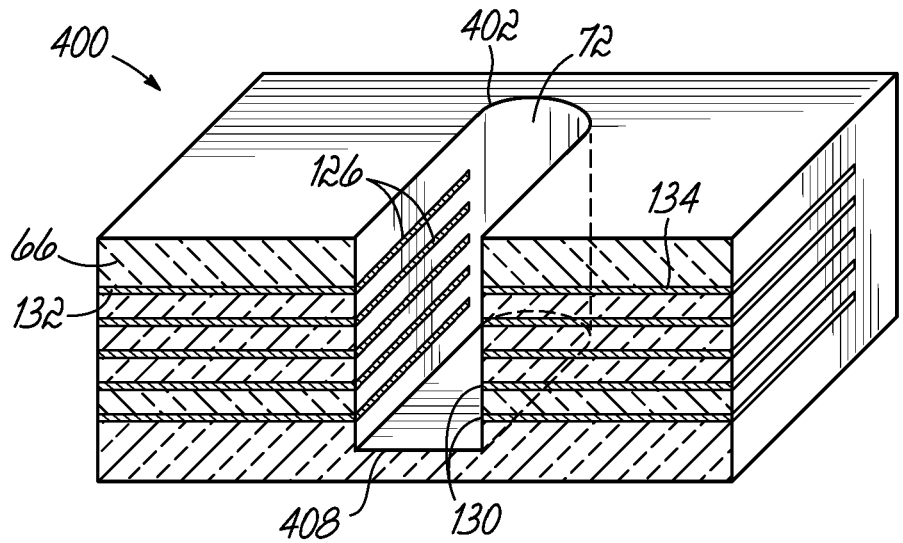
FIG. 21C is a partially sectioned perspective of the integrated multilayer capacitor of FIG. 21A.
Figure 21D:
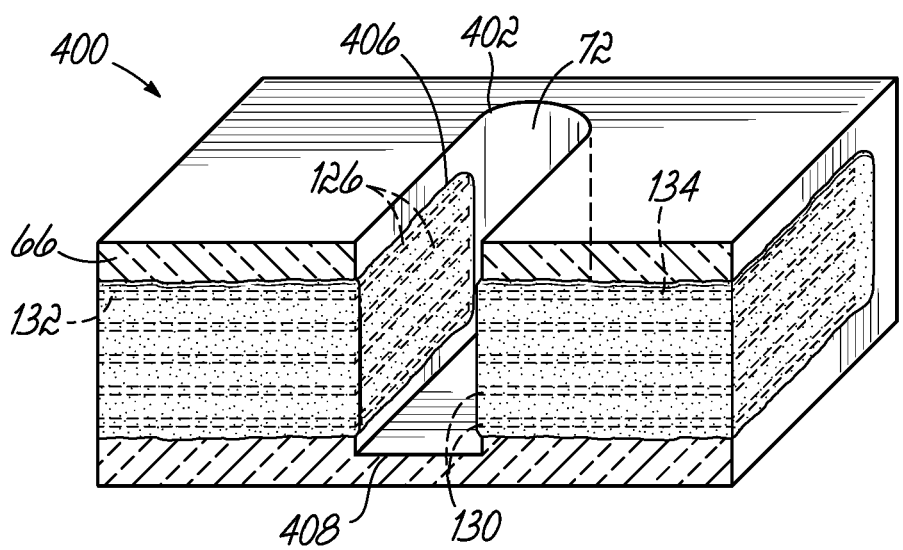
FIG. 21D is a partially sectioned perspective of the integrated multilayer capacitor of FIG. 21B.

Additionally, the void 72 is open to the external environment of the capacitor 390 through multiple openings. The void 72 includes a first end 392 and a second end 394, both of which are exposed to the external environment of the capacitor 390. Some embodiments, as exemplified by FIGS. 20D-20F, include an additional third end 396 that is exposed to the external environments of the capacitor 390. The void 72 forms an air gap that prevents conduction between the coplanar plates 132, 134, but allows for a fringe effect capacitance between the oppositely charged edges 126, 130. Additionally, embodiments that utilize multiple sets of oppositely charged edges 126, 130 may have the same charge edges bridged using electro-plating to create a parallel plate capacitor, as illustrated by electro-plating 398 in FIG. 20F. FIGS. 20A and 20C depict the void 72 in a cylindrical shape, however alternative embodiments may utilize a different shape for the void 72. Some examples may include a conical shape (FIG. 20B), a rectangular shape (FIGS. 20D and 20F), and a partially rounded shape (FIG. 20E).

FIGS. 21A-21D illustrates an alternative embodiment of the multilayer broadband capacitor of FIG. 17A. The capacitor 400 includes a void 72 that is open to the external environment of the capacitor 400 in a single area. In this embodiment, the void 72 separates multiple conductive layers 122 into sets of a first coplanar plate 132 and a second coplanar plate 134, with spaced apart, oppositely charged edges 126, 130. The void 72 is open to the external environment of the capacitor 400 through a single opening. In the embodiment shown in FIG. 21A, the void 72 includes a first end 402 and a second end 404. The first end 402 is exposed to the external environment of the capacitor 400 while the second end 404 is bordered by surrounding the dielectric layer 66. The void 72 forms an air gap that prevents conduction between the sets of coplanar plates 132, 134, but allows for a fringe effect capacitance between the sets of oppositely charged edges 126, 130. Additionally, the multiple sets of oppositely charged edges 126, 130 may have the same charge edges bridged using electro-plating to create a parallel plate capacitor, as illustrated by electro-plating 406 in FIGS. 21B and 21D.

As mentioned above, the one or more voids 72 in the dielectric body 64 can be formed before, during, or after the sintering process. A number of different processing techniques may be employed to form a void in the dielectric material. In particular, a void may be formed in a dielectric layer by drilling before the sintering process. Each effected ceramic layer may be mechanically punched, such as with a pin tip drill, or air drilled, hydraulically drilled, or laser drilled. The desired void size is drilled or cut into the green ceramic sheet prior to layering the individual sheet in the capacitor stack. In addition to drilling individual layers, it is also envisioned that the dielectric body can be formed as two open-faced halves. The center of each half could be drilled to the desired void size, and then the two halves of the body joined together and sintered. This manufacturing method could be employed in embodiments, such as shown in FIGS. 9A and 9B, in which a large void is formed in the dielectric body 64.

A void may also be formed into a green ceramic sheet using a photochemical process. In this process a ceramic sheet having a photosensitive binder is placed on a metallization layer or film. The photosensitive ceramic sheet is then exposed to radiation, to which the photosensitive binder is sensitive, at the desired void locations. Solvent is then used to wash out the ceramic dielectric from the exposed regions, leaving the voids in the ceramic. The above drilling or photochemical processes may be repeated with additional layers to form the desired size and number of voids in the stacked capacitor structure. Further details of the above manufacturing methods are disclosed in commonly-assigned, U.S. Pat. No. 6,366,443, which is incorporated herein by reference.

Figure 15A:
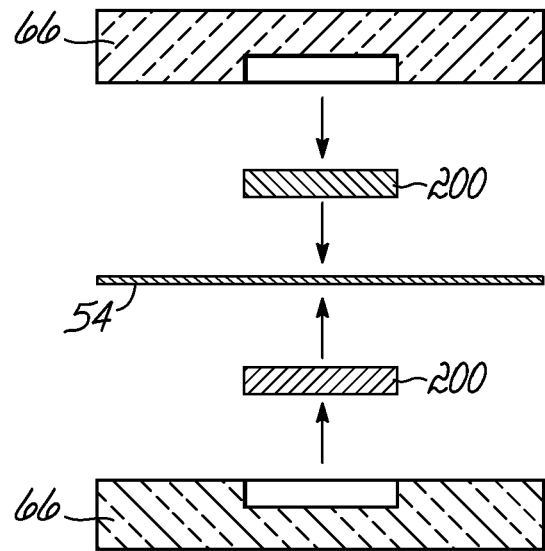
FIG. 15A is a schematic depiction of an initial step in an exemplary manufacturing process using a fugitive material.
Figure 15B:
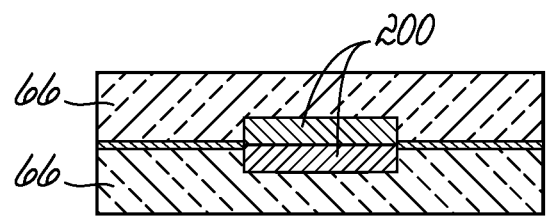
FIG. 15B is a schematic depiction of an intermediary step in the manufacturing process, showing the fugitive material placed between the dielectric layers.
Figure 15C:
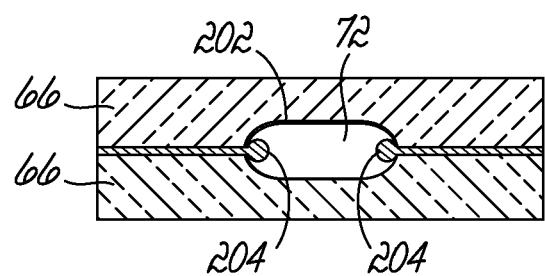
FIG. 15C is a schematic depiction of the dielectric layers and conductive plates following melt-off of the fugitive material.

In addition to drilling the ceramic sheets, an individual conductive layer may be drilled to form an opening for void 72. In particular, for the embodiments shown in FIGS. 7A, 8A, 10A, 11A, 12A, 13A, 14A, 16A, 17A, 18A, 19A, 20A and 21A, the individual conductive layer 122 may be drilled, using any of the techniques listed above, to divide the conductive layer into separate, oppositely charged plates separated by void 72. Additionally, one or more voids 72 may be formed in a ceramic sheet and conductive layer during the sintering process by placing a fugitive material plug of the desired void size into each effected green ceramic sheet during the layering process, as shown in FIGS. 15A and 15B. The plug 200, which has a lower melting point than the surrounding ceramic dielectric layer 66, will be burned off during the sintering process. The fugitive material, such as for example graphite with a silver additive, is selected so that the plug burns off after the surrounding ceramic material has at least partially hardened, leaving a void in the position of the plug, as shown in FIG. 15C. The lower melting point of the plug 200 will produce enhanced melting in the surrounding dielectric material, as indicated at 202. When placed on a conductive layer, the enhanced melting will create a void 72 and also cause melt back at the exposed ends of the conductive plates, forming nubs 204 as shown in FIG. 15C.

In addition, a void may be formed between the edges of a single conductive layer, for the embodiments shown in FIGS. 7A and 8A, by inserting a fugitive material, such as, for example, an organic compound (e.g., a polymer), into the conductive layer at the desired void location, prior to placement of the layer into the capacitor stack. During the sintering process, the fugitive material is burned off, forming a gap at the desired location and separating the layer into two separate conductive plates with nub ends.

The various capacitor embodiments have been described as having an air-filled void at least partially internal to the ceramic body. In addition to air, an internal void according to the present disclosure can be filled with other types of gases including, for example, nitrogen or argon, depending upon the application. An internal void may be filled with a particular gas by filling the kiln with the gas during the sintering process so that the gas permeates the pores of the ceramic material, and fills the pre-drilled voids or the voids formed as fugitive material burns off. In addition to filling the void 72 with a gas, in is envisioned that a vacuum could be formed within the void.

The placement of a void in a known location between two adjacent conductive layers in a dielectric body to create a known, high frequency capacitor differs from the previously known random formation of voids. The intentional formation of the voids during manufacturing enables a useable capacitance to be formed between adjacent conductive plates, using the void as a dielectric medium. Furthermore, using the methods described herein, the desired location of the one or more voids can be predetermined based on the intended application or desired capacitance.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

What is claimed is:

1. A ceramic capacitor comprising:
    a plurality of dielectric layers and a plurality of conductive layers sintered together to form a substantially monolithic ceramic body, the body defining at least one void between the dielectric and conductive layers, the void being partially enclosed within the ceramic body and bounded by at least a portion of a dielectric layer, a first conductive layer, and a second conductive layer, the first and second conductive layers having no conductive connection therebetween.

2. The capacitor of claim 1, wherein the first and second conductive layers each have an end bordering the void, the first and second layer ends being sufficiently close together as to form a fringe effect capacitance in the void.

3. The capacitor of claim 1, wherein the first conductive layer at least partially overlays the second conductive layer and the void is between the overlaying layers.

4. The capacitor of claim 3, wherein the void is spaced between the first and second conductive layers in a vertical direction.

5. The capacitor of claim 3, wherein the capacitor further comprises a low frequency, higher capacitance value section and a high frequency, lower capacitance value section, the overlay between the layers being substantially greater in the low frequency, higher capacitance value section.

6. The capacitor of claim 1, wherein a capacitance is formed in the void by a fringe effect field between the first and second conductive layers.

7. The capacitor of claim 6, wherein a high frequency capacitance is formed in the void.

8. The capacitor of claim 6, wherein at least some of the plurality of dielectric layers are interleaved with at least some of the plurality of conductive layers in the ceramic body to form an additional, lower frequency capacitance.

9. The capacitor of claim 1, further comprising a second void at least partially enclosed within the ceramic body and bounded by at least a portion of a dielectric layer, a third conductive layer and a fourth conductive layer, the third and fourth conductive layers having no conductive connection therebetween.

10. The capacitor of claim 9 wherein the third and fourth layers each have an end bordering the second void, the third and fourth layer ends being sufficiently close to form a second fringe effect capacitance in the second void.

11. The capacitor of claim 1, wherein the capacitor further comprises a low frequency, higher capacitance value section and a high frequency, lower capacitance value section, the vertical spacing between conductive layers being substantially greater in the high frequency, lower capacitance value section.

12. A capacitor comprising:
a substantially monolithic dielectric body comprising a plurality of dielectric layers;
a plurality of conductive first layers disposed within the dielectric body between the dielectric layers and electrically connected to a first conductive contact on the dielectric body;
a plurality of conductive second layers disposed within the dielectric body between the dielectric layers and electrically connected to a second conductive contact on the dielectric body, the plurality of second layers interleaved with the plurality of first layers and separated by the dielectric layers to form capacitances between the layers; and
at least one set of first and second conductive plates separated by a void, the void partially enclosed by the dielectric body and bordered by at least a portion of a first dielectric layer, a portion of a second dielectric layer and adjacent edges of first and second conductive plates, the first and second conductive plates being spaced apart to form a nonconductive capacitive connection through the void.

13. The capacitor of claim 12, wherein the first and second conductive plates are spaced apart to form a fringe effect capacitance within the void.

14. The capacitor of claim 13, wherein the first and second conductive plates are coplanar.

15. A method of making a monolithic ceramic capacitor containing at least one air gap capacitance, the method comprising:
providing a plurality of layers of a dielectric ceramic;
providing a plurality of conductive layers;
stacking the conductive and dielectric layers in an interleaving fashion;
sintering the interleaved layers to form a monolithic ceramic body;
forming a void in the monolithic ceramic body, the void being partially enclosed by the monolithic ceramic body, and bounded by at least a portion of a first and a second dielectric layer and portions of a first conductive layer and a second conductive layer,
wherein the steps of sintering and forming a void further comprises providing a fugitive material in at least one of the plurality of layers of dielectric material and burning away the fugitive material during the sintering step to form the void.

16. A method of making a monolithic ceramic capacitor containing at least one air gap capacitance, the method comprising:
providing a plurality of layers of a dielectric ceramic;
providing a plurality of conductive layers;
stacking the conductive and dielectric layers in an interleaving fashion;
sintering the interleaved layers to form a monolithic ceramic body;
forming a void in the monolithic ceramic body, the void being partially enclosed by the monolithic ceramic body, and bounded by at least a portion of a first and a second dielectric layer and portions of a first conductive layer and a second conductive layer,
wherein the step of forming a void further comprises drilling an opening into at least one of the plurality of layers of a dielectric ceramic, at least one of the plurality of conductive layers, or combinations thereof.

17. A method of making a monolithic ceramic capacitor containing at least one air gap capacitance, the method comprising:
providing a plurality of layers of a dielectric ceramic;
providing a plurality of conductive layers;
stacking the conductive and dielectric layers in an interleaving fashion;
sintering the interleaved layers to form a monolithic ceramic body;
forming a void in the monolithic ceramic body, the void being partially enclosed by the monolithic ceramic body, and bounded by at least a portion of a first and a second dielectric layer and portions of a first conductive layer and a second conductive layer,
wherein the step of forming a void further comprises punching an opening into at least one of the plurality of layers of a dielectric ceramic, at least one of the plurality of conductive layers, or combinations thereof.

18. A method of making a monolithic ceramic capacitor containing at least one air gap capacitance, the method comprising:
providing a plurality of layers of a dielectric ceramic;
providing a plurality of conductive layers;
stacking the conductive and dielectric layers in an interleaving fashion;
sintering the interleaved layers to form a monolithic ceramic body;
forming a void in the monolithic ceramic body, the void being partially enclosed by the monolithic ceramic body, and bounded by at least a portion of a first and a second dielectric layer and portions of a first conductive layer and a second conductive layer,
wherein the step of forming a void further comprises laser cutting an opening into at least one of the plurality of layers of a dielectric ceramic, at least one of the plurality of conductive layers, or combinations thereof.

* * * * *